United States Patent
Fujiyoshi et al.

(10) Patent No.: US 7,041,512 B2
(45) Date of Patent: May 9, 2006

(54) ELECTRON BEAM EXPOSURE APPARATUS, ELECTRON BEAM EXPOSING METHOD, SEMICONDUCTOR ELEMENT MANUFACTURING METHOD, AND PATTERN ERROR DETECTION METHOD

(75) Inventors: Kouji Fujiyoshi, Tokyo (JP); Masami Takigawa, Tokyo (JP)

(73) Assignee: Advantest Corp., Tokyo (JP)

( * ) Notice: Subject to any disclaimer, the term of this patent is extended or adjusted under 35 U.S.C. 154(b) by 57 days.

(21) Appl. No.: 10/712,594

(22) Filed: Nov. 12, 2003

(65) Prior Publication Data

US 2004/0104357 A1 Jun. 3, 2004

Related U.S. Application Data

(63) Continuation-in-part of application No. PCT/JP02/04594, filed on May 13, 2002.

(30) Foreign Application Priority Data

| Jun. 7, 2001 | (JP) | ............................. 2001-172645 |
| Dec. 4, 2002 | (JP) | ............................. 2002-353141 |

(51) Int. Cl.
  *H01L 21/00* (2006.01)
  *G02B 5/00* (2006.01)
(52) U.S. Cl. ........................................ 438/5; 250/505.1
(58) Field of Classification Search ................... 438/5; 250/505.1
  See application file for complete search history.

(56) References Cited

U.S. PATENT DOCUMENTS

| 4,774,461 | A | * | 9/1988 | Matsui et al. ............... 348/126 |
| 5,180,920 | A | * | 1/1993 | Kai et al. ................ 250/492.2 |
| 5,329,130 | A | * | 7/1994 | Kai et al. .............. 250/492.22 |
| 5,798,196 | A | * | 8/1998 | Okino .......................... 430/30 |
| 5,849,436 | A | * | 12/1998 | Yamada et al. ................. 430/5 |
| 5,895,924 | A | * | 4/1999 | Yasuda et al. ......... 250/492.22 |
| 6,881,968 | B1 | * | 4/2005 | Yamada ................. 250/492.23 |

FOREIGN PATENT DOCUMENTS

| JP | 60-9121 | 1/1985 |
| JP | 5-190435 | 7/1993 |
| JP | 7-192985 | 7/1995 |
| JP | 7-235477 | 9/1995 |
| JP | 8-279450 | 10/1996 |

* cited by examiner

*Primary Examiner*—W. David Coleman
(74) *Attorney, Agent, or Firm*—Muramatsu & Associates

(57) ABSTRACT

An electron beam exposure apparatus for exposing a wafer with an electron beam includes a section for generally controlling a wafer exposing system, a first buffer memory for temporarily storing exposure data, a second buffer memory for temporarily storing the exposure data, a first exposing section for irradiating the wafer with an electron beam based on exposure data output from the first buffer memory, and a first comparing section for comparing exposure data output from the first buffer memory with exposure data output from the second buffer memory and notifying the comparison results to the general control section. The exposure data stored in the first buffer memory and the exposure data stored in the second buffer memory are identical to one another when no error is involved. Further, an exposure apparatus and a pattern error detection method for accurately detecting an error of an exposure pattern formed to a wafer is disclosed.

24 Claims, 11 Drawing Sheets

ELECTRON BEAM EXPOSURE APPARATUS, ELECTRON BEAM EXPOSING METHOD, SEMICONDUCTOR ELEMENT MANUFACTURING METHOD, AND PATTERN ERROR DETECTION METHOD

CROSS-REFERENCE TO RELATED APPLICATIONS

The present application is a continuation-in-part (CIP) application of PCT Application No. PCT/JP02/004594 filed on May 13, 2002 and published as PCT Publication No. WO 02/101802 A1, claiming priority from Japanese Patent Application No. 2001-172645 filed on Jun. 7, 2001, the contents of which are incorporated herein by reference. Further, the present application claims priority from Japanese Patent Application No. 2002-353141 filed on Dec. 4, 2002.

BACKGROUND OF INVENTION

Since an electron beam exposure apparatus includes mechanical portions, such as an electron optics body tube and a wafer stage, and hardware portions, such as a digital control section and an analog amplifier, various abnormalities are likely to occur in the system. Therefore, in order to expose a wafer accurately in the electron beam exposure apparatus, it is required to detect these abnormalities in the system certainly.

For example, an electron beam exposure apparatus disclosed by the Japanese Patent Application Laid-Open No. 1996-279450 includes: a buffer memory for temporarily storing exposure data stored in hard disk; two pattern generation sections for outputting shot data, which are divisions of the exposure data output from the buffer memory being split into shots; a first comparing section for comparing two shot data output from the two pattern generation sections respectively; two pattern correction sections for correcting and outputting the shot data output from the two pattern generation sections respectively; a second comparing section for comparing the two shot data output from the two pattern correction sections respectively; two exposure sections for performing exposure based on the shot data output from the two pattern correction sections respectively; and a third comparing section for comparing the pattern generated by the two exposure sections. Based on the comparison result by the first comparing section, the comparison result by the second comparing section and the comparison result by the third comparing section, the electron beam exposure apparatus detects an abnormality of the data, and specifies cause of the abnormality in the system.

However, the buffer memory of the electron beam exposure apparatus, which is disclosed by the Japanese Patent Application Laid-Open No. 1996-279450, is required to output normal exposure data. Therefore, in case that the buffer memory does not operate normally and there appears an abnormality in the exposure data output from the buffer memory, the electron beam exposure apparatus is neither capable of detecting the abnormality of the data, nor specifying the cause of the abnormality in the apparatus.

SUMMARY OF INVENTION

According to one aspect of the present invention, there is provided an electron beam exposure apparatus for exposing a wafer by an electron beam. The electron beam exposure apparatus includes: a general control section for controlling the electron beam exposure apparatus collectively; a first buffer memory for temporarily storing exposure data, which is data of an exposure pattern to be formed on the wafer; a second buffer memory for temporarily storing the exposure data; a first exposure section for applying the electron beam to the wafer based on the exposure data output from the first buffer memory; and a first comparing section for comparing the exposure data output from the first buffer memory with the exposure data output from the second buffer memory, and for notifying the comparison result to the general control section.

The first comparing section may notify the general control section whether the exposure data output from the first buffer memory is consistent with the exposure data output from the second buffer memory as the comparison result, and the general control section may store the comparison result in association with an exposure area to be exposed based on the exposure data.

The first comparing section may compare the exposure data output from the first buffer memory with the exposure data output from the second buffer memory bit by bit.

The electron beam exposure apparatus may further include: a second exposure section for applying an electron beam to a different wafer from the wafer based on the exposure data output from the first buffer memory; a first pattern generation section for generating shot data, which is the exposure data output from the first buffer memory being split into shots; a second pattern generation section for generating shot data, which is the exposure data output from the first buffer memory being split into shots; and a second comparing section for comparing the shot data output from the first pattern generation section with the shot data output from the second pattern generation section, and for notifying the comparison result to the general control section.

The second comparing section may notify the general control section whether the shot data output from the first pattern generation section is consistent with the shot data output from the second pattern generation section as the comparison result, and the general control section may store the comparison result notified from the second comparing section in association with the comparison result notified from the first comparing section.

The electron beam exposure apparatus may further include a second exposure section for applying an electron beam to the different wafer based on the exposure data output from the second buffer memory.

The electron beam exposure apparatus may further include: a first pattern correction section for correcting the shot data output from the first pattern generation section; a second pattern correction section for correcting the shot data output from the second pattern generation section; and a third comparing section for comparing the shot data output from the first pattern correction section with the shot data output from the second pattern correction section, and for notifying the comparison result to the general control section.

The third comparing section may notify the general control section whether the shot data output from the first pattern correction section is consistent with the shot data output from the second pattern correction section as the comparison result, and the general control section may store the comparison result notified from the third comparing section in association with the comparison result notified from the first comparing section.

According to one aspect of the present invention, there is provided an electron beam exposing method of exposing a wafer by an electron beam. The electron beam exposing method includes steps of: writing exposure data, which is data of an exposure pattern to be formed on the wafer, in a first buffer memory; writing the exposure data in a second buffer memory; applying the electron beam to the wafer based on the exposure data output from the first buffer memory; and comparing the exposure data output from the first buffer memory with the exposure data output from the second buffer memory.

According to one aspect of the present invention, there is provided a semiconductor element manufacturing method of exposing a wafer by an electron beam and manufacturing a semiconductor element. The semiconductor element manufacturing method includes steps of: writing exposure data, which is data of an exposure pattern to be formed on the wafer, in a first buffer memory; writing the exposure data in a second buffer memory; applying the electron beam to the wafer based on the exposure data output from the first buffer memory; and comparing the exposure data output from the first buffer memory with the exposure data output from the second buffer memory.

The comparing step may include a step of outputting whether the exposure data output from the first buffer memory is consistent with the exposure data output from the second buffer memory as the comparison result, and the semiconductor element manufacturing method may further include a step of storing the comparison result in association with an exposure area to be exposed based on the exposure data.

The semiconductor element manufacturing method may further include steps of: judging whether the exposure pattern formed to the exposure area is to be inspected based on the comparison result stored in the storage step; and inspecting whether the desired exposure pattern is formed on the exposure area based on the judgment result in the judgment step.

According to the one aspect of the present invention, there is provided an exposure apparatus for writing a desired exposure pattern to a wafer. The exposure apparatus includes: a buffer memory storing thereon exposure data, which is data of an exposure pattern to be formed on the wafer; a comparing section for comparing a first exposure data output from the buffer memory based on a first control signal for exposing a first area with a second exposure data output from the buffer memory based on a second control signal for exposing a second area where the same exposure pattern as the first area is to be written; and an error detection section for detecting an error of the exposure pattern formed to the wafer based on the comparison result by the comparing section.

The exposure apparatus may further include a first expect memory storing thereon the first exposure data output from the buffer memory. The comparing section may compare the first exposure data output from the first expect memory with the second exposure data output from the buffer memory. The comparing section may compare the first exposure data output from the first expect memory with the second exposure data output from the buffer memory bit by bit.

The exposure apparatus may further include a comparison result storing section storing thereon information indicating whether the first exposure data and the second exposure data are the same as each other as a comparison result in association with identification information on the second area. The error detection section may detect an error of the exposure pattern formed to the wafer based on the comparison result stored on the comparison result storing section.

The comparing section may compare the first exposure data output from the first expect memory with a third exposure data output from the buffer memory based on a third control signal for exposing a third area where the same exposure pattern as the first area is to be written, the comparison result storing section may store information indicating whether the first exposure data and the second exposure data are the same as each other, and information indicating whether the first exposure data and the third exposure data are the same as each other, as the comparison result, and the error detection section may judge that there is an error in the exposure pattern formed to the third area when the first exposure data and the second exposure data are the same as each other and the first exposure data differs from the third exposure data, and may judge that there is an error in the exposure pattern formed to the first area when the first exposure data differs from the second exposure data and the first exposure data differs from the third exposure data.

The exposure apparatus may further include a wafer stage mounting thereon the wafer for exposing the wafer while the wafer stage is moving in a first direction and then changing the direction and moving in a second direction opposite from the first direction. In case that the wafer stage changes the direction, the first exposure data output from the buffer memory may be written to the first expect memory.

The exposure apparatus may further include a second expect memory storing thereon the second exposure data output from the buffer memory. The comparing section may compare the second exposure data output from the second expect memory with the third exposure data output from the buffer memory based on a third control signal for exposing a third area where the same exposure pattern as the first area is to be written.

The exposure apparatus may further include: a first expect memory control section for causing the first exposure data to be written to the first expect memory while the buffer memory is outputting the first exposure data, for causing the comparing section to read the first exposure data from the first expect memory while the buffer memory is outputting the second exposure data, and for causing the third exposure data to be written to the first expect memory while the buffer memory is outputting the third exposure data; and a second expect memory control section for causing the second exposure data to be written to the second expect memory while the buffer memory is outputting the second exposure data, and for causing the comparing section to read the second exposure data from the second expect memory while the buffer memory is outputting the third exposure data.

According to one aspect of the present invention, there is provided a pattern error detection method of detecting an error of an exposure pattern formed to a wafer. The pattern error detection method includes steps of: exposing the wafer using a first exposure data output from buffer memory based on a first control signal for exposing a first area; exposing the wafer using a second exposure data output from the buffer memory based on a second control signal for exposing a second area where the same exposure pattern as the first area is to be written; comparing the first exposure data with the second exposure data; and detecting the error of the exposure pattern formed to the wafer based on a comparison result in the comparison step.

According to one aspect of the present invention, there is provided an exposure apparatus for writing a desired exposure pattern to a wafer. The exposure apparatus includes: a buffer memory storing thereon exposure data, which is data of the exposure pattern to be formed on the wafer; an expect data generating section for generating a first expect data, which is an expected value of the exposure data to be output from the buffer memory based on a first control signal for exposing a first area; a comparing section for comparing a first exposure data output from the buffer memory based on the first control signal with the first expect data generated by the expect data generating section; an exposure section for exposing the wafer based on the first exposure data output from the buffer memory; and an error detection section for detecting an error of an exposure pattern formed to the wafer based on a comparison result by the comparing section.

The exposure apparatus may further include a first expect memory storing thereon the first expect data generated by the expect data generating section. The comparing section may compare the first expect data output from the first expect memory with the first exposure data output from the buffer memory.

The exposure apparatus may further include a wafer stage mounting thereon the wafer. The wafer stage may move in a first direction, then may change the direction and may move to a second direction opposite from the first direction, the exposure section may perform first exposure processing on the first area while the wafer stage is moving in the first direction and may perform second exposure processing on the first area while the wafer stage is moving in the second direction, and the first expect data may be written to the first expect memory between the first exposure processing and the second exposure processing.

The exposure apparatus may further include a wafer stage mounting thereon the wafer. The wafer stage may move in a first direction, then change the direction and move to a second direction opposite from the first direction, the exposure section may perform second exposure processing on the first area while the wafer stage is moving in the second direction after it has performed first exposure processing on the first area while the wafer stage has been moving in the first direction, and the first expect data, which is generated by the expect data generating section, may be written to the first expect memory during the first exposure processing.

The exposure apparatus may further include a second expect memory storing thereon second expect data to be output from the buffer memory based on a second control signal for exposing a second area. The wafer stage may change the direction once again to the first direction after it has moved in the second direction, the exposure section may perform third exposure processing on the second area while the wafer stage is moving in the first direction after performing the second exposure processing on the first area while the wafer stage has been moving in the second direction, the comparing section may compare the first expect data output from the first expect memory during the second exposure processing with the first exposure data output from the buffer memory, and the second expect data, which is generated by the expect data generating section, may be written to the second expect memory during the second exposure processing.

According to one aspect of the present invention, there is provided a pattern error detection method of detecting an error of the exposure pattern formed to a wafer. The pattern error detection method includes steps of: generating a first expect data, which is an expected value of exposure data to be output from buffer memory based on a first control signal for exposing a first area; comparing a first exposure data output from the buffer memory based on the first control signal with the first expect data generated in the expect data generation step; exposing the wafer based on the first exposure data output from the buffer memory; and detecting an error of the exposure pattern formed to the wafer based on a comparison result in the comparison step.

The summary of the invention does not necessarily describe all necessary features of the present invention. The present invention may also be a sub-combination of the features described above. Other aspects and advantages of the invention will be apparent from the following description and the appended claims.

DETAILED DESCRIPTION

The invention will now be described based on the preferred embodiments, which do not intend to limit the scope of the present invention, but exemplify the invention. All of the features and the combinations thereof described in the embodiment are not necessarily essential to the invention.

Figure 1:
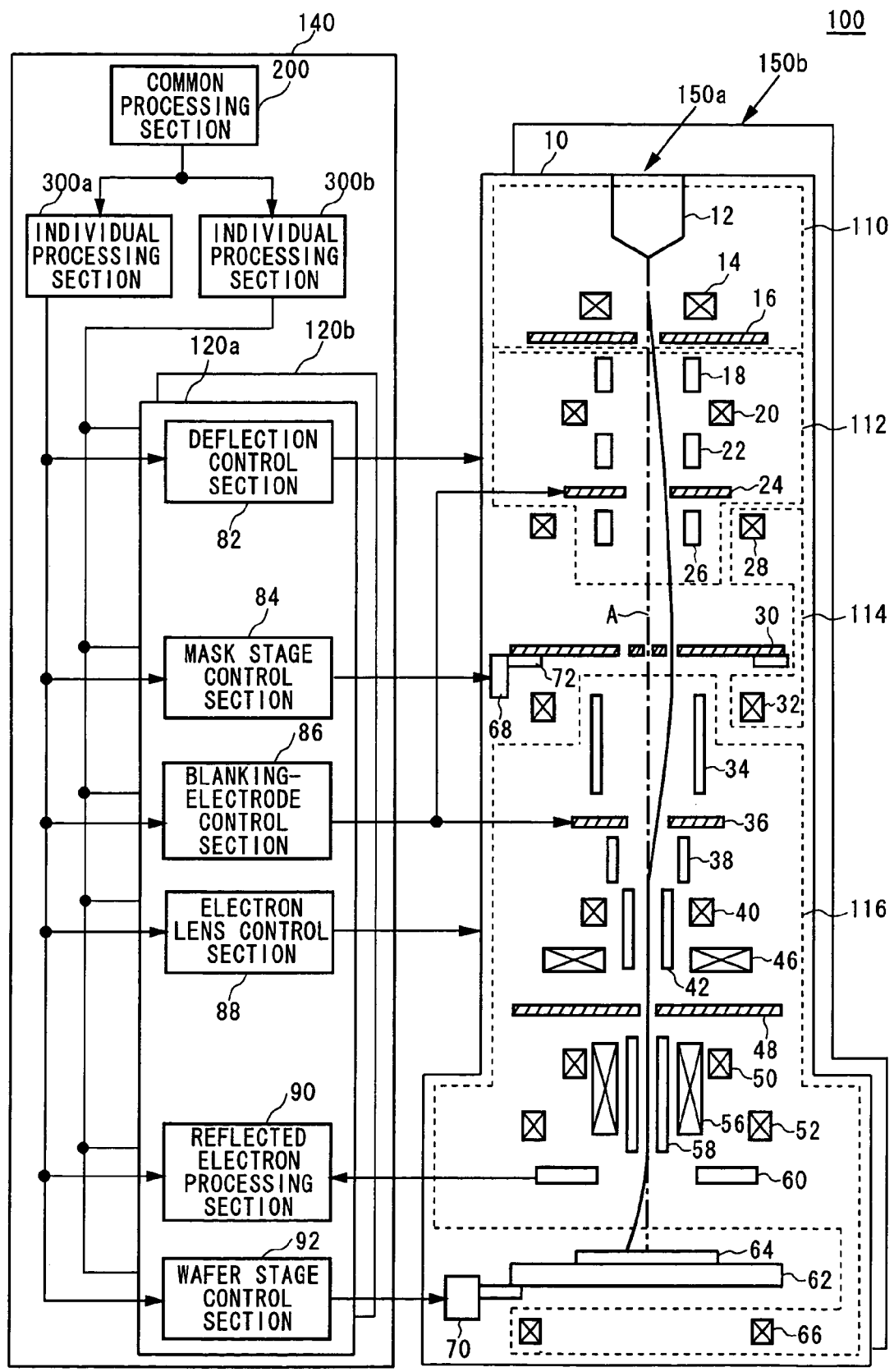
FIG. 1 is a schematic view showing a configuration of an electron beam exposure apparatus according to an embodiment of the present invention.

FIG. 1 is a block diagram of an electron beam exposure apparatus 100 according to an embodiment of the present invention. The electron beam exposure apparatus 100 includes exposure sections 150a and 150b for performing a predetermined exposure processing on a wafer 64 by an electron beam, and a control system 140 for controlling operation of each component of the exposure sections 150a and 150b.

The exposure sections 150a and 150b include an electron optics system, which includes: an electron beam discharge system 110 for discharging a predetermined electron beam into a case 10; a mask projection system 112 for deflecting the electron beam discharged from the electron beam discharge system 110, and for adjusting an image focus location of the electron beam into the vicinity of a mask 30; a focal point adjustment lens system 114 for adjusting the image focus location of the electron beam into the vicinity of the wafer 64; and a wafer projection system 116 for deflecting the electron beam, which has passed through the mask 30, to a predetermined area of the wafer 64 mounted on a wafer stage 62, and for adjusting a direction and a size of an image of a pattern which is to be formed on the wafer 64.

Moreover, the exposure sections 150a and 150b include a stage system which includes: a mask stage 72 on which the mask 30 is mounted, where the mask 30 includes a plurality of opening patterns which are shaped into shapes which are to be formed on the wafer 64; a mask stage drive section 68 for driving the mask stage 72; a wafer stage 62 on which the wafer 64 is mounted, where the patterns are to be formed on the wafer; and a wafer stage drive section 70 for driving the wafer stage 62. Furthermore, the exposure sections 150*a* and 150*b* include a reflected electron detector 60 for detecting electrons scattered from a direction of the wafer stage 62, and converting the amount of scattered electrons into a corresponding electrical signal for adjustment of the electron optics system.

The electron beam discharge system 110 includes a first electron lens 14 for determining a focal point position of the electron beam generated by the electron gun 12, and a slit section 16 with an opening (slit) having a rectangle shape through which the electron beam passes. Since it takes a predetermined time for the electron gun 12 to generate the electron beam stably, the electron gun 12 may generate the electron beam consecutively during a period of the exposure processing. It is preferable that the slit is formed according to the shape of the block including the predetermined pattern formed in the mask 30. An alternate long and short dash line A in FIG. 1 indicates an optical axis of the electron beam discharged from the electron beam discharge system 110, in a case where the electron beam is not deflected by the electron optics system.

The mask projection system 112 includes: a first deflector 18, a second deflector 22, and a third deflector 26 as a mask deflection system for deflecting the electron beam; a second electron lens 20 as a mask focus system for adjusting a focal point of the electron beam; and a first blanking electrode 24. The first deflector 18 and the second deflector 22 deflect the electron beam to a predetermined area on the mask 30. For example, the predetermined area is a block including a pattern which is to be formed on the wafer 64. When the electron beam passes through the pattern, a cross-sectional shape of the electron beam becomes the shape of the pattern. Here, the image of the electron beam which has passed through the block, in which the predetermined pattern is formed, is defined as the pattern image. The third deflector 26 deflects a direction of the electron beam, which has passed through the first deflector 18 and the second deflector 22, to a direction substantially parallel with the optical axis A. The second electron lens 20 has a function for focusing the image of the opening of the slit section 16 onto the mask 30 mounted on the mask stage 72.

The first blanking electrode 24 deflects the electron beam so that the electron beam may not hit the block of the mask 30. It is preferable that the first blanking electrode 24 deflects the electron beam so that the electron beam may not hit the mask 30. Since the pattern formed in the mask 30 deteriorates by the irradiation of the electron beam, the first blanking electrode 24 deflects the electron beam when the pattern is not formed on the wafer 64, so that the deterioration of the mask 30 is prevented. The focal point adjustment lens system 114 includes a third electron lens 28 and a fourth electron lens 32. The electron beam is focused on the wafer 64 by the third electron lens 28 and the fourth electron lens 32. The wafer projection system 116 includes a fifth electron lens 40, a sixth electron lens 46, a seventh electron lens 50, an eighth electron lens 52, a ninth electron lens 66, a fourth deflector 34, a fifth deflector 38, a sixth deflector 42, a main deflector 56, a sub deflector 58, a second blanking electrode 36, and a round aperture section 48.

The pattern image is rotated due to influence of an electric field and/or a magnetic field. The fifth electron lens 40 adjusts rotation of the pattern image of the electron beam which has passed through the predetermined opening pattern of the mask 30. The sixth electron lens 46 and the seventh electron lens 50 adjust the reduction ratio of the pattern image formed on the wafer 64 with respect to the pattern formed on the mask 30. The eighth electron lens 52 and the ninth electron lens 66 function as objective lenses. The fourth deflector 34 and the sixth deflector 42 deflect the electron beam to the direction of the optical axis A at a downstream of the mask 30 in the discharging direction of the electron beam. The fifth deflector 38 deflects the electron beam to a direction substantially parallel with the optical axis A. The main deflector 56 and the sub deflector 58 deflect the electron beam so that the electron beam is projected on the predetermined area of the wafer 64. In the present embodiment, the main deflector 56 is used for deflecting the electron beam in a subfield including a plurality of areas which can be irradiated by single shot of the electron beam (to be referred to as shot area hereinafter), and the sub deflector 58 is used for the deflection between the shot areas in the subfield.

The round aperture section 48 includes a circular opening (round aperture). The second blanking electrode 36 deflects the electron beam so that it hits outside of the round aperture. Therefore, the second blanking electrode 36 prevents the electron beam from going to the downstream of the round aperture section 48 in the discharging direction of the electron beam. Since the electron gun 12 consecutively discharges the electron beam during the period of the exposure processing, it is preferable that the second blanking electrode 36 deflects the electron beam so that the electron beam may not go to the downstream of the round aperture section 48, when changing the patterns to be formed on the wafer 64, or when changing the areas in the wafer 64 on which the pattern is to be formed.

The control system 140 includes a common processing section 200, individual processing sections 300*a* and 300*b*, and individual control sections 120*a* and 120*b*. The individual control sections 120*a* and 120*b* include a deflection control section 82, a mask stage control section 84, a blanking-electrode control section 86, an electron lens control section 88, a reflected electron processing section 90, and a wafer stage control section 92. The common processing section 200 supplies exposure data stored in the hard disk to the individual processing sections 300*a* and 300*b*. The individual processing sections 300*a* and 300*b* supply the control data about exposure processing to each of the control sections of the individual control sections 120*a* and 120*b* based on the exposure data supplied from the common processing section 200. The deflection control section 82 controls the first deflector 18, the second deflector 22, the third deflector 26, the fourth deflector 34, the fifth deflector 38, the sixth deflector 42, the main deflector 56, and the sub deflector 58. The mask stage control section 84 controls the mask stage drive section 68, and moves the mask stage 72.

The blanking electrode control section 86 controls the first blanking electrode 24 and the second blanking electrode 36. In the present embodiment, it is preferable that the first blanking electrode 24 and the second blanking electrode 36 are controlled so that the electron beam is to be projected on the wafer 64 at the period of the exposure processing, and the electron beam is not projected on the wafer 64 except the period of the exposure processing. The electron lens control section 88 controls electric power supplied to the first electron lens 14, the second electron lens 20, the third electron lens 28, the fourth electron lens 32, the fifth electron lens 40, the sixth electron lens 46, the seventh electron lens 50, the eighth electron lens 52, and the ninth electron lens 66. The reflected electron processing section 90 detects digital data indicating the amount of electrons based on an electrical signal detected by the reflected electron detector 60. The wafer stage control section 92 moves the wafer stage 62 to a predetermined position using the wafer stage drive section 70.

Operation of the electron beam exposure apparatus 100 according to the present embodiment will be explained. The mask 30 including a plurality of blocks, each of which is shaped into a predetermined pattern, is mounted on the mask stage 72, and the mask 30 is fixed to a predetermined position. For example, the exposure processing is performed in oxidizing atmosphere, such as ozone gas or $O_2$ plasma gas. In this case, it is preferable that the surface of the mask 30 is coated with material which is not oxidized by strong oxidizing ozone gas or the like. Moreover, the wafer 64, on which the exposure processing is performed, is mounted on the wafer stage 62. The wafer stage control section 92 causes the wafer stage drive section 70 to move the wafer stage 62 so that the area to be exposed on the wafer 64 is located in the vicinity of the optical axis A. Moreover, since the electron gun 12 discharges the electron beam consecutively during the period of the exposure processing, the blanking-electrode control section 86 controls the first blanking electrode 24 and the second blanking electrode 36 so that the electron beam which has passed through the opening of the slit section 16 is not projected on the mask 30 and the wafer 64 before the exposure processing. In the mask projection system 112, the electron lens 20 and the deflectors (18, 22, 26) are adjusted so that the electron beam is projected to the block having a shape which is to be formed on the wafer 64. In the focal point adjustment lens system 114, the electron lenses (28, 32) are adjusted so that the electron beam is focused on the wafer 64. Moreover, in the wafer projection system 116, the electron lenses (40, 46, 50, 52, 66) and the deflectors (34, 38, 42, 56, 58) are adjusted so that the pattern image is formed on a predetermined area of the wafer 64.

After the adjustment of the mask projection system 112, the focal point adjustment lens system 114, and the wafer projection system 116 are completed, the blanking-electrode control section 86 causes the first blanking electrode 24 and the second blanking electrode 36 to stop the deflection of the electron beam. Thereby, as explained hereinafter, the electron beam is projected on the wafer 64 through the mask 30. The electron gun 12 generates the electron beam, and the first electron lens 14 adjusts the focal point of the electron beam, so that it is projected on the slit section 16. Then, the first deflector 18 and the second deflector 22 deflect the electron beam which has passed through the slit section 16 so that it is projected on a predetermined area on the mask 30 at which the pattern to be formed is formed. The electron beam, which has passed through the opening of the slit section 16, has a rectangular cross-sectional shape. The third deflector 26 deflects the electron beam which has been deflected by the first deflector 18 and the second deflector 22 so that the direction of the electron beam becomes substantially parallel with the optical axis A. Moreover, the electron beam is adjusted by the second electron lens 20 so that the image of the opening of the slit section 16 is focused on a predetermined area of the mask 30.

Then, the electron beam which has passed through the pattern formed in the mask 30 is deflected in the direction toward the optical axis A by the fourth deflector 34 and the sixth deflector 42. The electron beam is further deflected by the fifth deflector 38 so that a direction of the electron beam becomes substantially parallel with the optical axis A. Moreover, the third electron lens 28 and the fourth electron lens 32 adjust the electron beam so that the image of the pattern formed in the mask 30 is focused on the surface of the wafer 64. The rotation of the pattern image of the electron beam is adjusted by the fifth electron lens 40. The reduction ratio of the pattern image is adjusted by the sixth electron lens 46 and the seventh electron lens 50. Then, the electron beam is deflected by the main deflector 56 and the sub deflector 58 so that it is projected on a predetermined shot area of the wafer 64. In the present embodiment, the main deflector 56 deflects the electron beam in a subfield including a plurality of shot areas, and the sub deflector 58 deflects the electron beam between the shot areas in the subfield. The electron beam deflected to the predetermined shot area is adjusted and projected on the wafer 64 by the electron lens 52 and the electron lens 66. In this way, the image of the pattern formed by the mask 30 is formed on the predetermined shot area on the wafer 64.

After a predetermined exposure time has elapsed, the blanking-electrode control section 86 controls the first blanking electrode 24 and the second blanking electrode 36 to deflect the electron beam so that the electron beam is not projected on the mask 30 and the wafer 64. The pattern formed in the mask 30 is formed on the predetermined shot area of the wafer 64 by the process described above. In order to form the pattern formed in the mask 30 to a second shot area, the electron lens 20 and the deflectors (18, 22, 26) are adjusted so that the electron beam is projected to the block having a pattern which is to be formed on the wafer 64 in the mask projection system 112. In the focal point adjustment lens system 114, the electron lenses (28, 32) are adjusted so that the electron beam is focused on the wafer 64. Moreover, in the wafer projection system 116, the electron lenses (40, 46, 50, 52, 66) and the deflectors (34, 38, 42, 56, 58) are adjusted so that the pattern image is formed on the predetermined area of the wafer 64.

Specifically, the sub deflector 58 adjusts an electric field so that the pattern image generated by the mask projection system 112 is formed on the second shot area. Then, the pattern is formed on the shot area in the same manner as described above. After forming a pattern on all shot areas which are to be exposed in the subfield, the main deflector 56 adjusts a magnetic field so that a pattern is formed on a second subfield. The electron beam exposure apparatus 100 repeats this exposure processing so that a desired circuit pattern is formed on the wafer 64.

The electron beam exposure apparatus 100, which is an electron beam processing apparatus according to the present invention, may be an electron beam exposure apparatus using a variable rectangle. Alternatively, it may be an electron beam exposure apparatus using a blanking aperture array device. Moreover, although the electron beam exposure apparatus 100 according to the present embodiment includes two individual processing sections 300a and 300b, two individual control sections 120a and 120b, and two exposure sections 150a and 150b, the electron beam exposure apparatus according to the present invention may be an electron beam exposure apparatus including three or more individual processing sections, three or more individual control sections, and three or more exposure sections. Alternatively, although the exposure section 150a and the exposure section 150b in the electron beam exposure apparatus 100 according to the present embodiment expose different wafers, as for the electron beam exposure apparatus according to the present invention, a plurality of exposure sections exposes the same wafer simultaneously.

Figure 2:
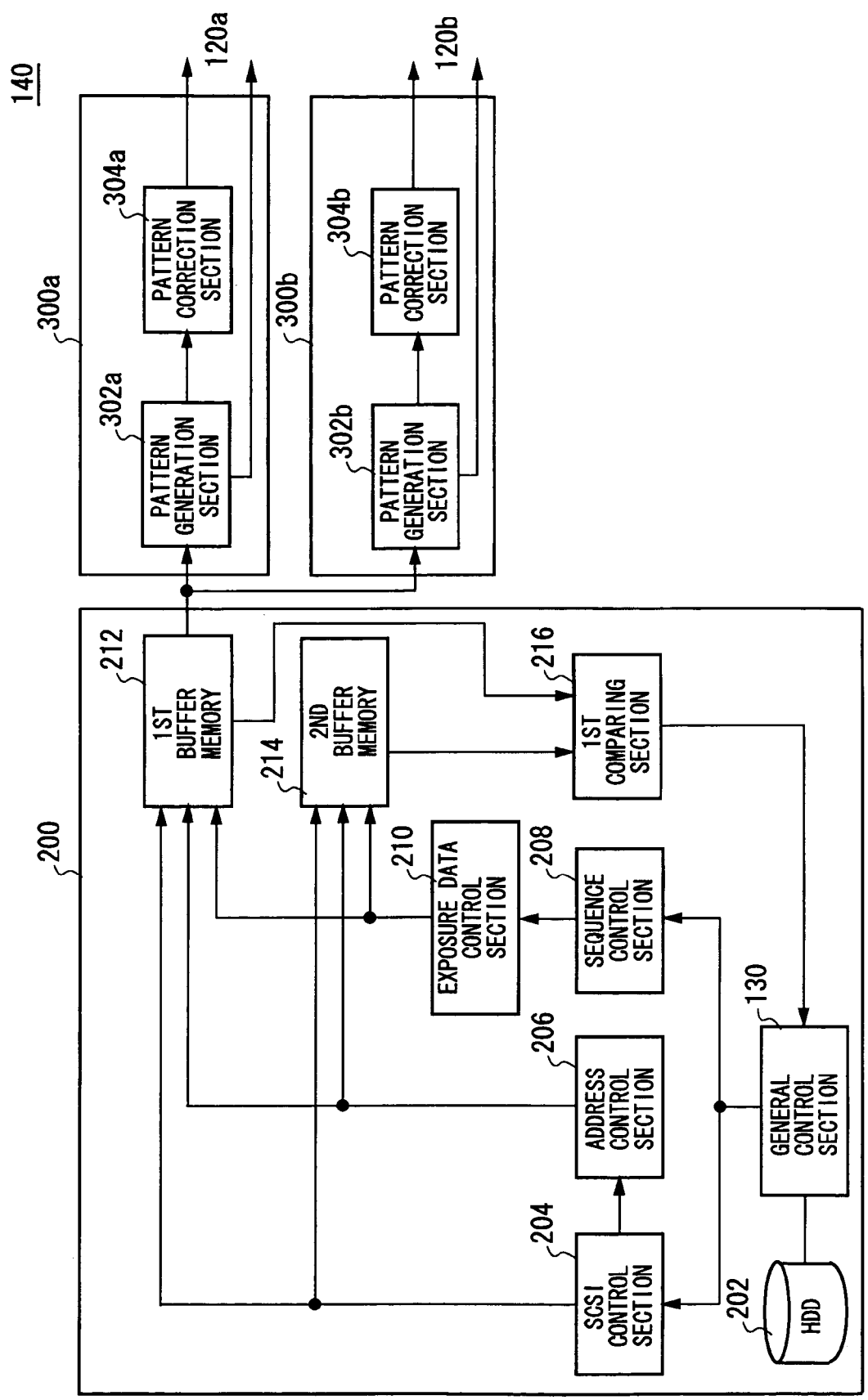
FIG. 2 is a block diagram showing a configuration of a control system according to the present embodiment.

FIG. 2 is a block diagram of the control system 140 according to the present embodiment. The common processing section 200 includes a hard disk drive (HDD) 202, a general control section 130, a SCSI control section 204, an address control section 206, a sequence control section 208, an exposure data control section 210, a first buffer memory 212, a second buffer memory 214, and a first comparing section 216. Moreover, the individual processing section 300a includes a pattern generation section 302a and a pattern correction section 304a. Moreover, the individual processing section 300b includes pattern generation section 302b and a pattern correction section 304b.

For example, the general control section 130 is an engineering work station, and collectively controls the electron beam exposure apparatus 100. During the exposure processing, the general control section 130 reads the exposure data, which is data of the exposure pattern which are to be formed on the wafer 64, from the hard disk drive 202, and supplies it to the SCSI control section 204 at first. Then, the SCSI control section 204 converts the exposure data received from the general control section 130 into a format of the first buffer memory 212 and the second buffer memory 214, makes the data synchronize with the address generated by the address control section 206. Then, the data is supplied to the first buffer memory 212 and the second buffer memory 214. Then, the first buffer memory 212 and the second buffer memory 214 store temporarily the exposure data received from the SCSI control section 204.

Next, the general control section 130 sends an exposure beginning flag to the exposure data control section 210 through the sequence control section 208. Then, on receiving the exposure beginning flag, the exposure data control section 210 supplies the address, in which the exposure data of the exposure pattern to be formed is stored, to the first buffer memory 212 and the second buffer memory 214. Then, the first buffer memory 212 supplies the exposure data corresponding to the address received from the exposure data control section 210 to the first comparing section 216 and the pattern generation section 302a. Moreover, the second buffer memory 214 supplies the exposure data corresponding to the address received from the exposure data control section 210 to the first comparing section 216.

Then, the first comparing section 216 compares the exposure data output from the first buffer memory 212 with the exposure data output from the second buffer memory 214, and notifies the comparison result to the general control section 130. Specifically, the first comparing section 216 notifies whether the exposure data output from the first buffer memory 212 is consistent with the exposure data output from the second buffer memory 214 to the general control section 130 as the comparison result. Then, the general control section 130 stores the comparison result received from the first comparing section 216 in association with the exposure area to be exposed based on the exposure data being compared. Moreover, the first comparing section 216 compares the exposure data output from the first buffer memory 212 with the exposure data output from the second buffer memory 214 bit by bit. By comparing them bit by bit, a fault in the first buffer memory 212 and the second buffer memory 214 is detected.

Next, the pattern generation section 302a generates the shot data, which is output from the first buffer memory 212 and split into shots, and supplies it to the pattern correction section 304a and the individual control section 120a. Then, the pattern correction section 304a corrects the shot data received from the pattern generation section 302a, and supplies it to the individual control section 120a. Then, each control section of the individual control section 120a controls each part of the exposure section 150a based on the shot data received from the pattern generation section 302a and the pattern correction section 304a. Then, the exposure section 150a applies the electron beam to the wafer, and forms the desired exposure pattern.

Moreover, the pattern generation section 302b generates the shot data, which is output from the first buffer memory 212 and split into shots, and supplies it to the pattern correction section 304b and the individual control section 120b. Then, the pattern correction section 304b corrects the shot data received from the pattern generation section 302b, and supplies it to the individual control section 120b. Then, each control section of the individual control section 120b controls each part of the exposure section 150b based on the shot data received from the pattern generation section 302b and the pattern correction section 304b. Then, the exposure section 150b applies the electron beam to the wafer, and forms the desired exposure pattern.

According to the electron beam exposure apparatus 100 of the present embodiment, the general control section 130 detects an abnormality of the first buffer memory 212 or the second buffer memory 214 by the first comparing section 216 comparing the exposure data output from the first buffer memory 212 and the second buffer memory 214. Moreover, the electron beam exposure apparatus 100 according to the present embodiment compares the exposure data output from the first buffer memory 212 and the second buffer memory 214, without delaying the exposure processing by including the second buffer memory 214 for storing the exposure data for the comparison.

Figure 3:
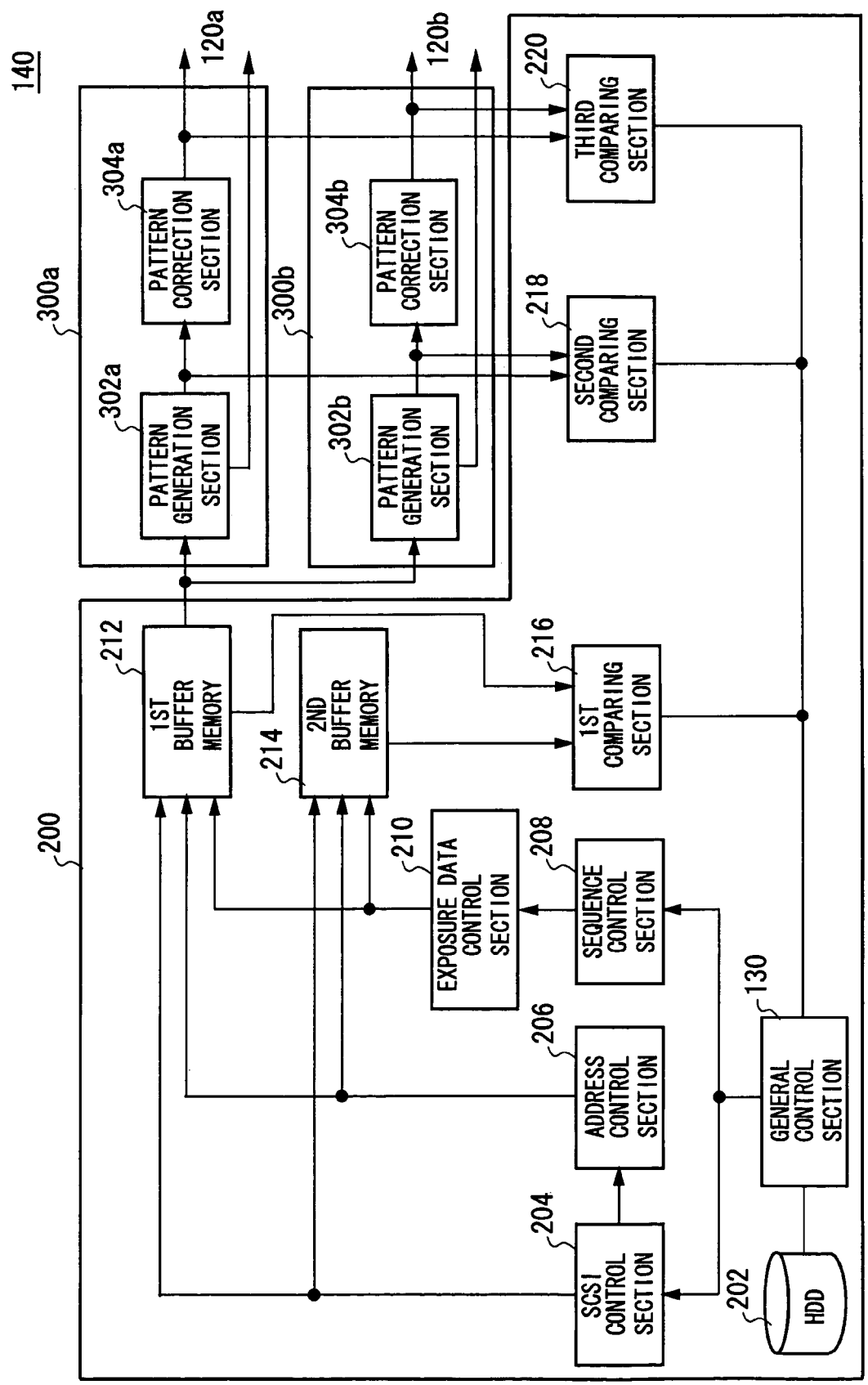
FIG. 3 is a block diagram showing a configuration of the control system according to the present embodiment.

FIG. 3 is a block diagram of the control system 140 according to the present embodiment. The common processing section 200 further includes a second comparing section 218 and a third comparing section 220. The second comparing section 218 compares the shot data output from the pattern generation section 302a with the shot data output from the pattern generation section 302b, and notifies the comparison result to the general control section 130. The second comparing section 218 notifies whether the shot data output from the pattern generation section 302a is consistent with the shot data output from the pattern generation section 302b to the general control section 130 as the comparison result. Then, the general control section 130 stores the comparison result notified from the second comparing section 218 in association with the comparison result notified from the first comparing section 216. Based on the comparison result notified from the first comparing section 216 and the comparison result notified from the second comparing section 218, the general control section 130 detects an abnormality of the data, and specifies the cause of the abnormality of the apparatus.

Moreover, the third comparing section 220 compares the shot data output from the pattern generation section 302a with the shot data output from the pattern generation section 302b, and notifies the comparison result to the general control section 130. The third comparing section 220 notifies whether the shot data output from the pattern generation section 302a is consistent with the shot data output from the pattern generation section 302b to the general control section 130 as the comparison result. Then, the general control section 130 stores the comparison result notified from the third comparing section 220 in association with the comparison result notified from the first comparing section 216. Based on the comparison result notified from the first comparing section 216 and the comparison result notified from the third comparing section 220, the general control section 130 detects an abnormality of the data, and specifies the cause of the abnormality of the apparatus.

Figure 4:
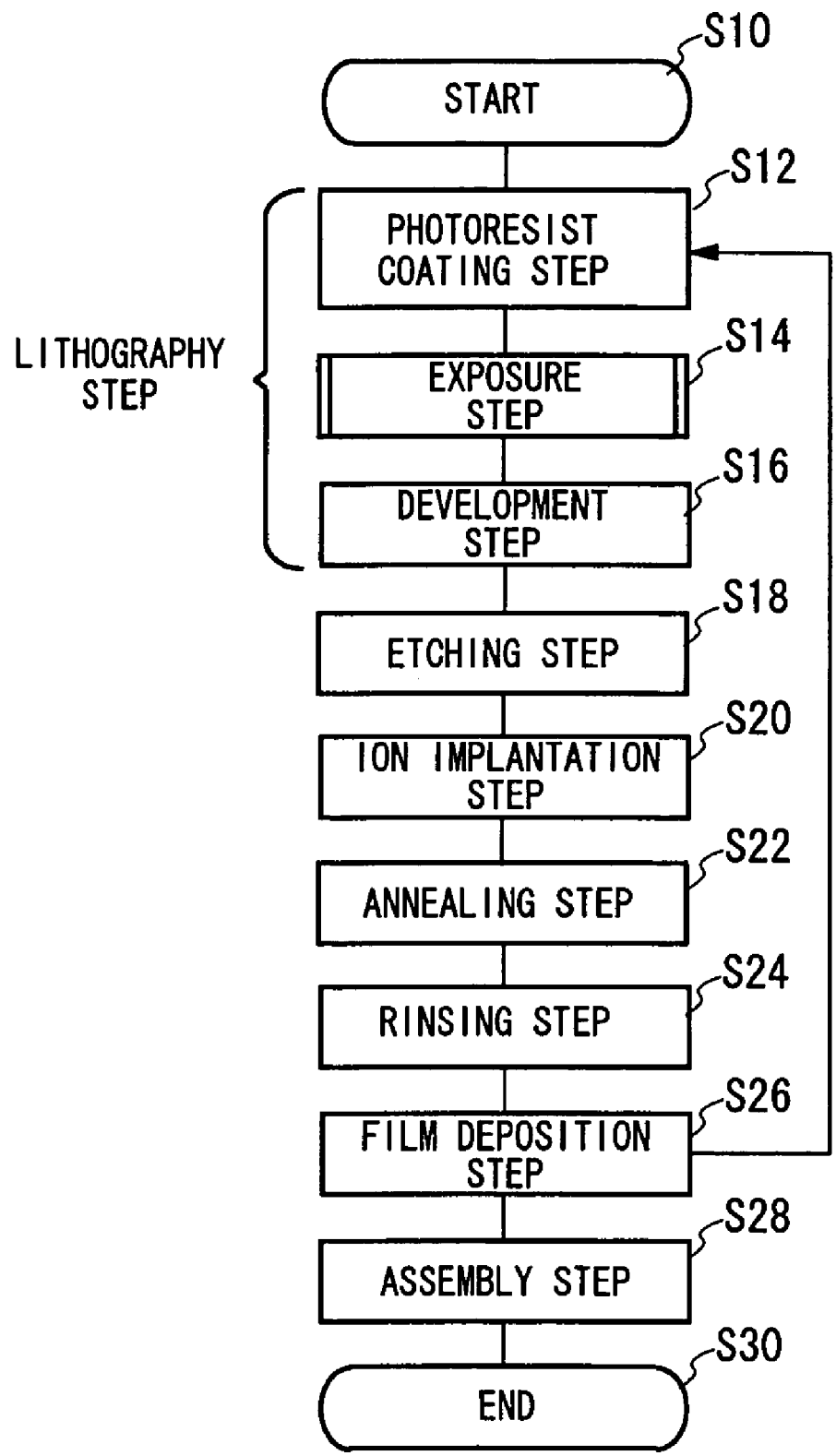
FIG. 4 is a flow chart of a semiconductor manufacturing process of manufacturing a semiconductor element from a wafer.

FIG. 4 is a flow chart of a semiconductor manufacturing method of manufacturing a semiconductor device from a wafer. This flow chart begins from S10. In a photoresist coating step, photoresist is coated on the upper surface of the wafer (S12). Then, the wafer, on which the photoresist is coated, is mounted on the wafer stage 62 of the electron beam exposure apparatus 100 shown in FIG. 1. In an exposure step, a pattern image is formed on the wafer by the electron beam which has passed through the mask 30, as explained in reference with FIG. 1 (S14).

Next, in a development step, the exposed wafer is dipped in developer, is developed, and excessive resist is removed (S16). Then, in an etching step, the silicon substrate, insulator layer, or electric conduction film, which is in the area where the photoresist on the wafer is removed, is etched by anisotropic etching using plasma (S18). Then, in an ion implantation step, impurity, such as boron and arsenic, is doped in the wafer to form semiconductor devices, such as transistors and diodes (S20). Then, in an annealing step, the wafer is annealed and the doped impurity is activated (S22). Then, in a rinsing step, the wafer is rinsed with chemical to remove the organic contamination and/or metal contamination on the wafer (S24). Then, in a film deposition step, a conductive layer or an insulator layer is deposited, and a wiring layer and an insulating layer between the wirings are formed (S26). The semiconductor device, which includes an isolation area, an element area, and a wiring layer on the wafer, is manufactured by combining and repeating steps from the photoresist coating step (S12) to the film deposition step (S26). Then, in an assembly step, the wafer, in which a predetermined circuit is formed, is sliced, and the chip is assembled (S28). The semiconductor device manufacturing flow ends in S30.

Figure 5:
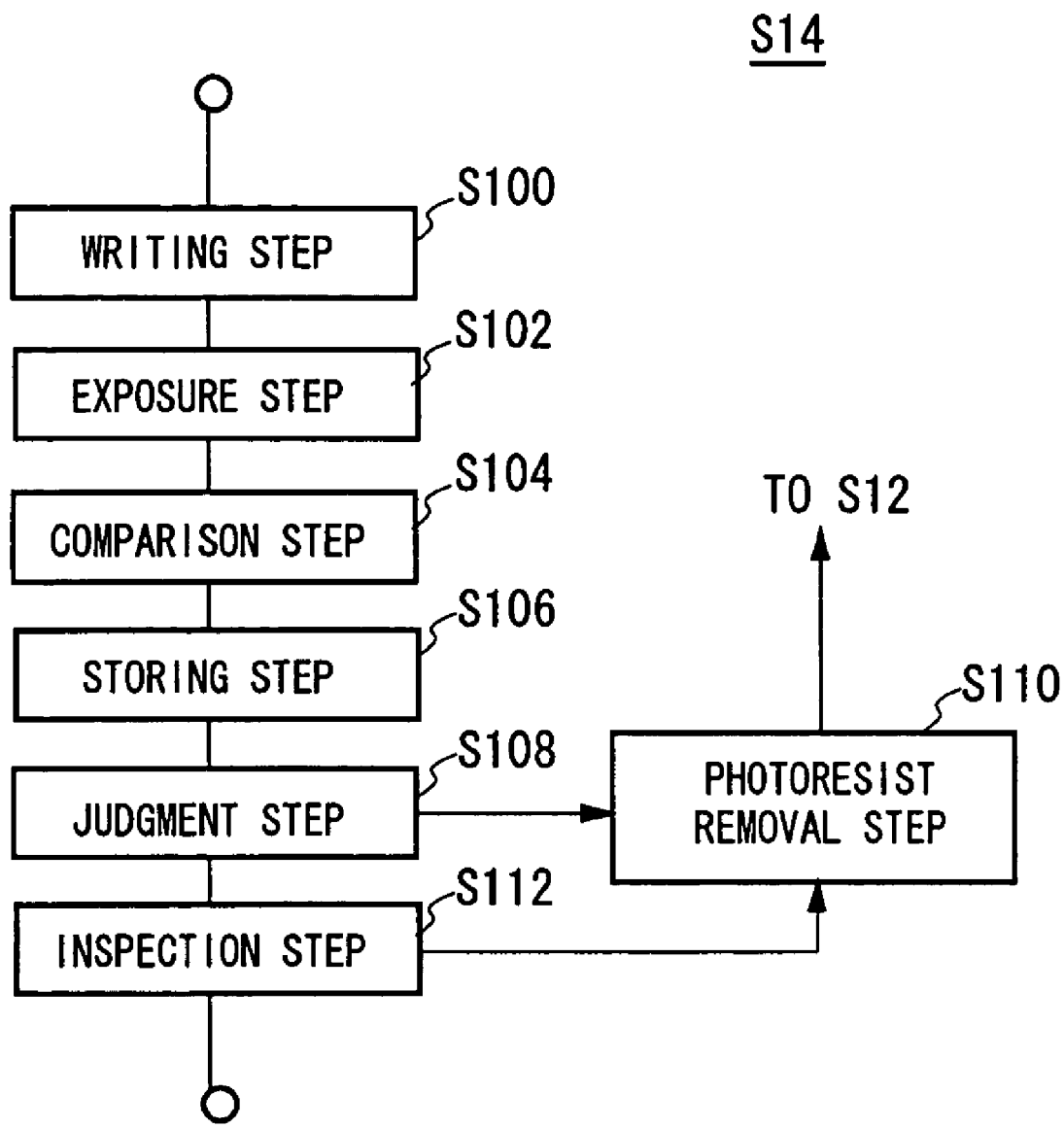
FIG. 5 is a flow chart of an exposure step of forming a pattern image to the wafer.

FIG. 5 is the flow chart of the exposure step (S14) of forming a pattern image on a wafer. First, the SCSI control section 204 writes the exposure data received from the general control section 130 to the first buffer memory 212 and the second buffer memory 214 (S100). Then, based on the exposure data output from the first buffer memory 212, the exposure section 150a applies the electron beam to the wafer and forms the pattern (S102). Moreover, the first comparing section 216 compares the exposure data output from the first buffer memory 212 with the exposure data output from the second buffer memory (S104). In the comparison step (S104), the first comparing section 216 outputs whether the exposure data output from the first buffer memory 212 is consistent with the exposure data output from the second buffer memory as the comparison result. Then, the general control section 130 stores the comparison result output from the first comparing section 216 in association with the exposure area to be exposed based on the exposure data being compared (S106). Then, the general control section 130 judges whether to inspect the exposed exposure pattern based on the comparison result stored in the step S106. Then, based on the judgment result in the judgment step (S108), it is inspected whether the desired exposure pattern is formed (S112).

In the judgment step (S108), if the exposure data output from the first buffer memory 212 is consistent with the exposure data output from the second buffer memory, the general control section 130 decides that the exposure pattern formed based on the exposure data is to be inspected, and proceeds to the processing of the inspection step (S112). Moreover, in the judgment step (S108), if the exposure data output from the first buffer memory 212 is not consistent with the exposure data output from the second buffer memory, the general control section 130 decides that the exposure pattern formed based on the exposure data is not to be inspected, and proceeds to the processing of the photoresist removal step (S110). Then, in the photoresist coating step (S12), photoresist is coated once again on the wafer from which the photoresist was once removed, then exposure processing is performed.

According to the electron beam exposure apparatus 100 in the present embodiment, the general control section 130 judges whether to carry out the inspection of the exposure pattern which is formed based on the comparison result by the first comparing section 212. Since the inspection step of inspecting the exposure pattern formed based on the exposure data can be omitted if the exposure data output from the first buffer memory 212 is not consistent with the exposure data output from the second buffer memory, a period required for the inspection of the exposure pattern is shortened. As a result, a period for manufacturing the semiconductor element is shortened.

According to an embodiment of the present invention, there is provided the electron beam exposure apparatus for detecting an abnormality of the buffer memory storing thereon the exposure data, which are the data of the exposure pattern.

Figure 6:
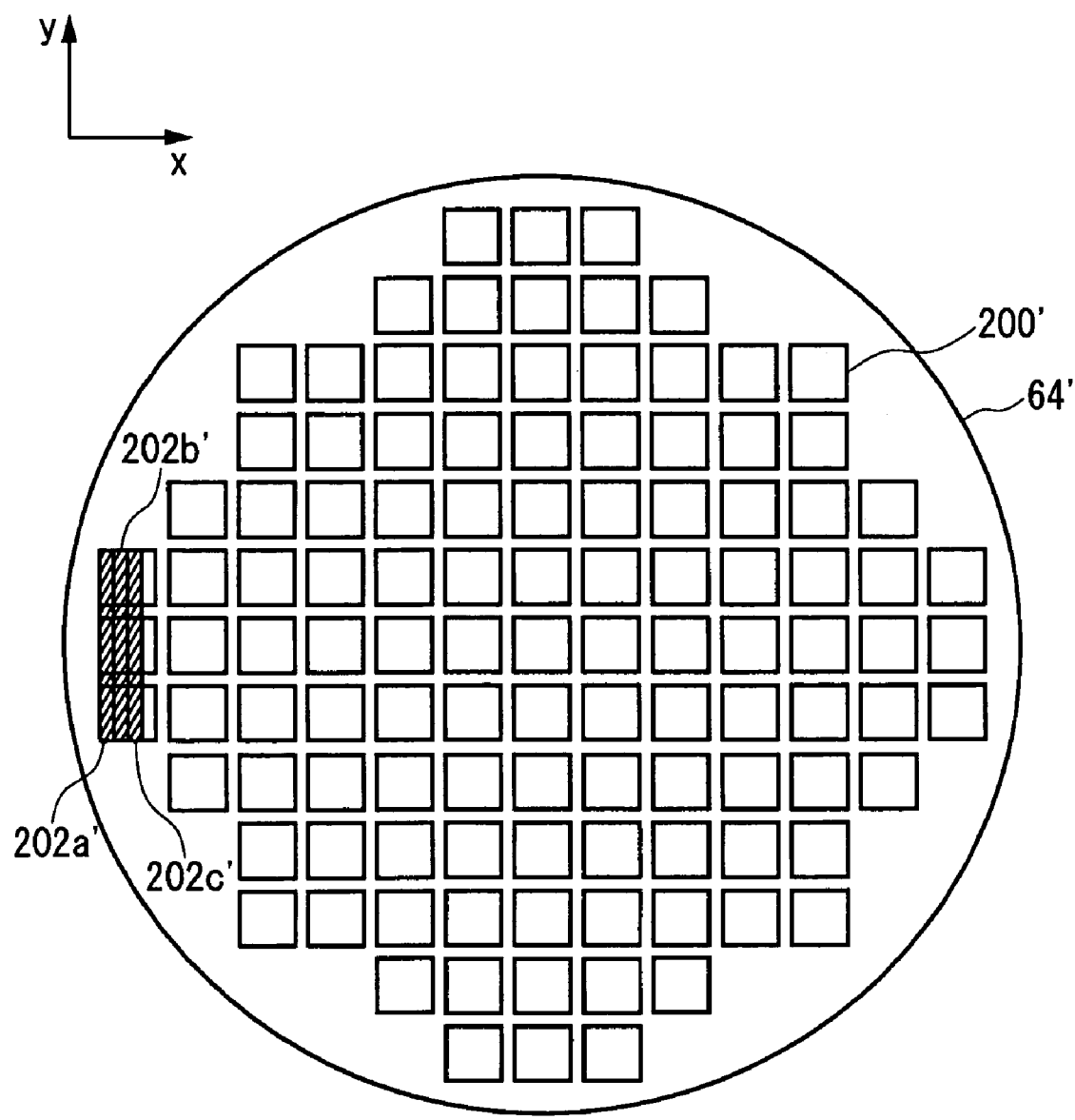
FIG. 6 is a plan view exemplary showing a frame area in a wafer.

FIG. 6 is a plan view exemplary showing a frame area in a wafer 64'. The frame area is an area to be exposed while the wafer stage 62' is moving in a predetermined direction. Moreover, the frame area is an area over a plurality of chip areas 200'. That is, a lateral length of the frame area is a peak swing of the main deflector 56', and a longitudinal length of the frame area is a width of the area in which chips are formed on the wafer 64'.

For example, in the electron beam exposure apparatus 100', while the wafer stage 62' is moving in a first direction (positive direction of y-axis), exposure section 150a' exposes a frame area 202a'. Then, after the frame area 202a' has been exposed, the wafer stage 62' moves transversely the length of the lateral width of a frame area in positive direction of x-axis, and then begins to move in a second direction (negative direction of y-axis) opposite from the first direction (positive direction of y-axis). Then, while the wafer stage 62' is moving in the second direction (negative direction of y-axis), the exposure section 150a' exposes a frame area 202b' adjoining the frame 202a'. Then, after the frame area 202b' has been exposed, the wafer stage 62' moves transversely the length of the lateral width of a frame area in positive direction of x-axis, and then begins to move in the first direction (positive direction of y-axis). Then, while the wafer stage 62' is moving in the first direction (positive direction of y-axis), the exposure section 150a' exposes a frame area 202c' adjoining the frame area 202b'.

As described above, the electron beam exposure apparatus 100' exposes all area of the plurality of chip areas 200' on the wafer 64' by repeating the exposure processing for each of the frame areas. In addition, in the present embodiment, it is preferable that the patterns written to the plurality of chip areas 200' are identical with one another.

Figure 7:
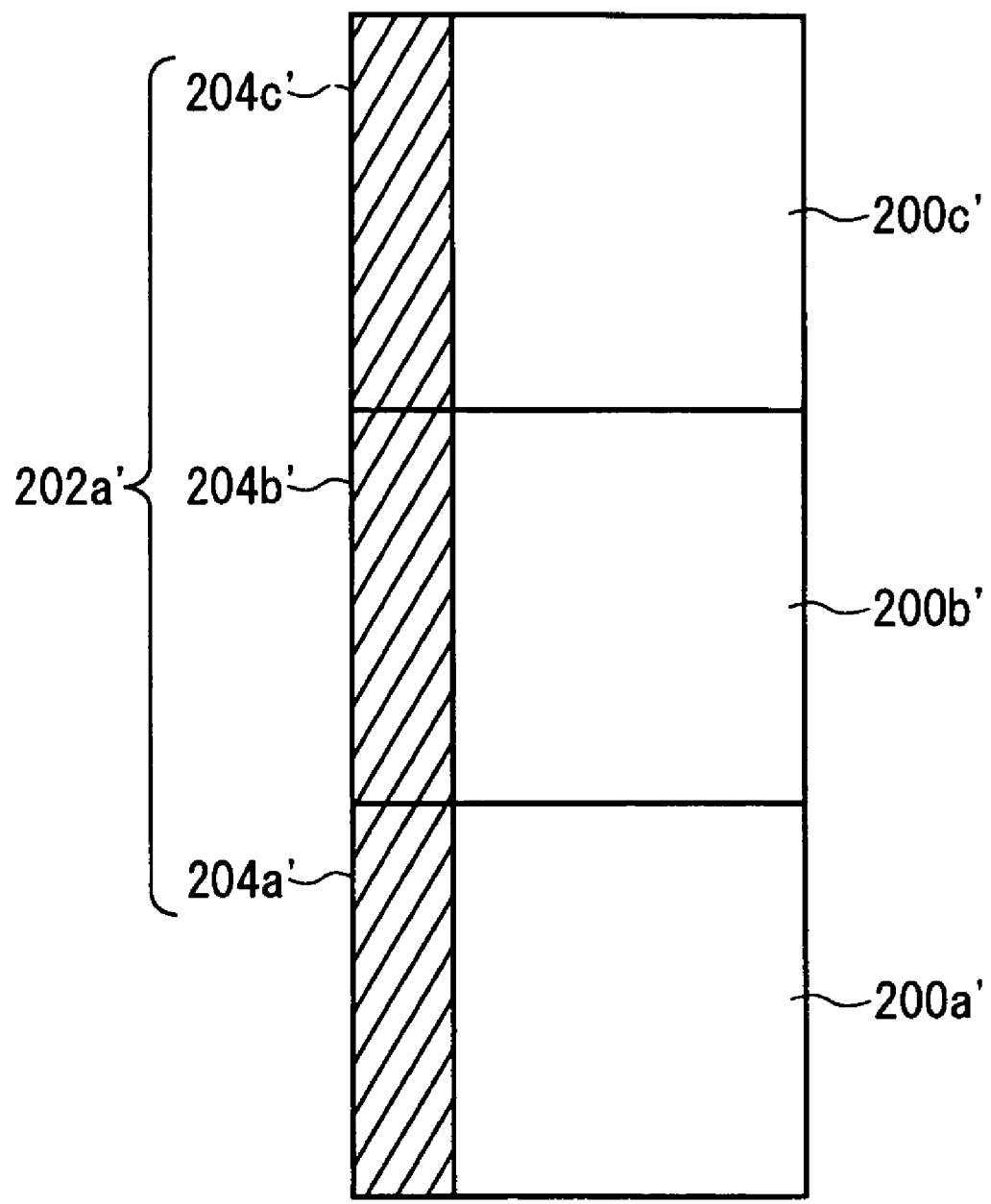
FIG. 7 is a plan view exemplary showing a band area in the wafer.

FIG. 7 is a plan view exemplary showing the band areas in the wafer 64'. Each of the band areas is a part of the frame area divided by a chip. That is, a lateral length of the band area is the peak swing of the main deflector 56', and a longitudinal length of the band area is a width of a chip area. For example, the frame 202a' includes a band area 204a' which is a part of the chip area 200a', a band area 204b' which is a part of the chip area 200b', and a band area 204c' which is a part of the chip area 200c'. In addition, in the present embodiment, it is preferable that the patterns written to the band areas 204a', 204b', and 204c' are identical with one another.

Figure 8:
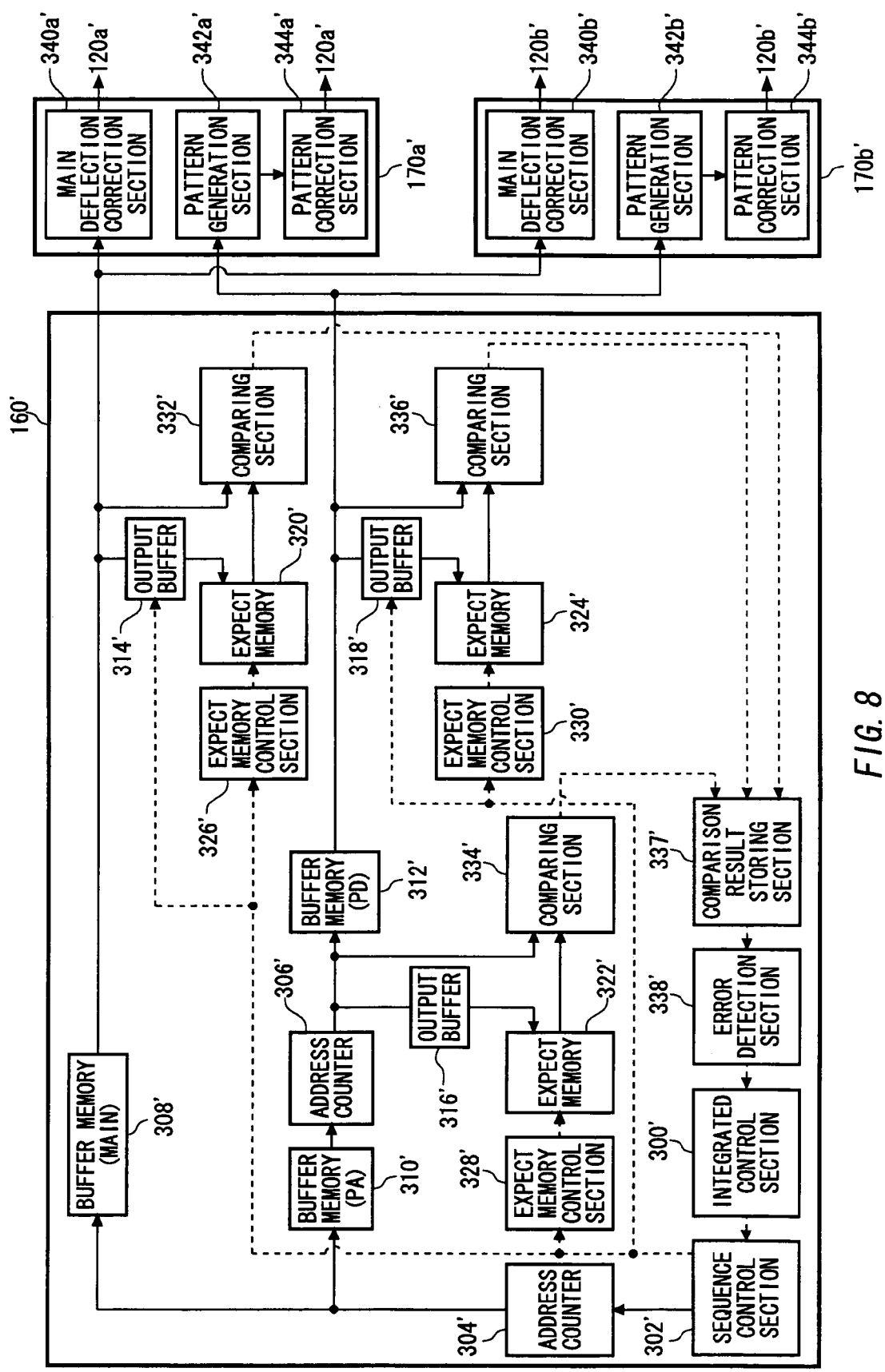
FIG. 8 is a block diagram exemplary showing a configuration of a control system.

FIG. 8 is a block diagram exemplary showing a configuration of the control system 140' according to the present embodiment. The common processing section 160' includes: an integrated control section 300'; a sequence control section 302'; address counters 304' and 306'; a buffer memory (main) 308'; a buffer memory (PA) 310'; a buffer memory (PD) 312'; output buffers 314', 316', and 318'; expect memories 320', 322', and 324'; expect memory control sections 326', 328', and 330'; comparing sections 332', 334', and 336'; a comparison result storing section 337'; and an error detection section 338'. The individual processing section 170a' includes a main deflection correction section 340a', a pattern generation section 342a', and a pattern correction section 344a'. The individual processing section 170b' includes a main deflection correction section 340b', a pattern generation section 342b', and a pattern correction section 344b'.

For example, the integrated control section 300' is an engineering workstation, and collectively controls the electron beam exposure apparatus 100'. During the exposure processing, the integrated control section 300' reads the exposure data, which is data of the exposure pattern which is to be formed on the wafer 64', from hard disk drive, and supplies it to the buffer memory (main) 308', the buffer memory (PA) 310' and the buffer memory (PD) 312' at first. Then, the buffer memory (main) 308', the buffer memory (PA) 310' and the buffer memory (PD) 312' store temporarily the exposure data received from the integrated control section 300'.

Next, the integrated control section 300' sends an exposure beginning flag to the sequence control section 302'. Then, on receiving the exposure beginning flag, the sequence control section 302' supplies a predetermined main starting address and quantity information to the address counter 304'. The address counter 304' generates the main address based on the main starting address and the quantity information, and supplies it to the buffer memory (main) 308' and the buffer memory (PA) 310'.

The buffer memory (main) 308' outputs the main data, which is the exposure data for controlling the main deflector 56', based on the main address received from the address counter 304', and supplies it to the main deflection correction sections 340a' and 340b'. Each of the main deflection correction sections 340a' and 340b' corrects the main data received from the buffer memory (main) 308', and supply it to the individual control sections 120a'and 120b', respectively.

The buffer memory (PA) 310' supplies the pattern starting address and the quantity information to the address counter 306' based on the main address received from the address counter 304'. The address counter 306' generates the pattern address based on the pattern starting address and the quantity information, and supplies it to the buffer memory (PD) 312'. The buffer memory (PD) 312' outputs the pattern data, which is the exposure data for controlling the sub deflector 58', based on the pattern address received from the address counter 306', and supplies it to the pattern generation sections 342a' and 342b'. Each of the pattern generation sections 342a' and 342b' generates the shot data, which is the pattern data received from the buffer memory (PD) 312' and split into shots, and supplies it to the pattern correction sections 344a' and 344b', respectively. Then, the pattern correction sections 344a' and 344b' correct the shot data received from the pattern generation sections 342a' and 342b', and supply it to the individual control sections 120a' and 120b', respectively.

Each control unit of the individual control sections 120a'and 120b' controls each part of the exposure sections 150a' and 150b' based on the main data received from the main deflection correction sections 340a' and 340b', and the shot data received from the pattern correction sections 344a' and 344b'. Then, each of the exposure sections 150a' and 150b' applies the electron beam to the wafer 64', and expose a desired exposure pattern.

The expect memory 320' stores the main data output from the buffer memory (main) 308'. The output buffer 314' switches whether to supply the main data, which is output from the buffer memory (main) 308', to the expect memory 320' based on control of the sequence control section 302'. The expect memory control section 326' controls read/write of the expect memory 320' (read control and write control) by supplying a read signal and a write signal based on the control of the sequence control section 302'. The comparing section 332' compares the main data output from the buffer memory (main) 308' with the main data output from the expect memory 320' bit by bit. Then, the comparison result storing section 337' stores the comparison result of the comparing section 332'.

The expect memory 322' stores the pattern starting address and the quantity information output from the buffer memory (PA) 310'. The output buffer 316' switches whether to supply the pattern starting address and the quantity information, which are output from the buffer memory (PA) 310', to the expect memory 322' based on control of the sequence control section 302'. The expect memory control section 328' controls read/write of the expect memory 322' (read control and write control) by supplying a read signal and a write signal based on the control of the sequence control section 302'. The comparing section 334' compares the pattern starting address and the quantity information output from the buffer memory (PA) 310' with the main data output from the expect memory 322' bit by bit. Then, the comparison result storing section 337' stores the comparison result of the comparing section 334'.

The expect memory 324' stores the pattern data output from the buffer memory (PD) 312'. The output buffer 318' switches whether to supply the pattern data, which is output from the buffer memory (PD) 312', to the expect memory 324' based on control of the sequence control section 302'. The expect memory control section 330' controls read/write of the expect memory 324' (read control and write control) by supplying a read signal and a write signal based on the control of the sequence control section 302'. The comparing section 336' compares the pattern data output from the buffer memory (PD) 312' with the pattern data output from the expect memory 324' bit by bit. Then, the comparison result storing section 337' stores the comparison result of the comparing section 336'.

The error detection section 338' detects the error of the exposure pattern formed to the wafer 64' based on the comparison results of the comparing sections 332', 334', and 336' stored on the comparison result storing section 337'. The integrated control section 300' stores identification information on the band area where the exposure pattern having the error, which is detected by the error detection section 338', is written.

Referring to FIGS. 6 and 7, operation of the common processing section 160' shown in FIG. 8, especially a pattern error detection method, will be explained specifically hereinafter. First, the exposure processing of the frame area 202a' shown in FIG. 6 is started. The exposure section 150a' exposes the frame area 202a' by causing the wafer stage 62' to move in the first direction (positive direction of y-axis). The buffer memory (main) 308' receives the first main address, which is an example of the control signal for exposing the band area 204a' shown in FIG. 7, from the address counter 304', outputs first main data, which is an example of the exposure data, and supplies it to the individual control section 170a'. Moreover, the output buffer 314' supplies the first main data output from the buffer memory (main) 308' to the expect memory 320'. The expect memory control section 326' causes the first main data to be written to the expect memory 320' while the buffer memory (main) 308' is outputting the first main data. Then, the expect memory 320' stores the first main data output from the buffer memory (main) 308' based on the first main address.

Moreover, the buffer memory (PA) 310' receives the first main address from the address counter 304', outputs a first pattern starting address and first quantity information, which are examples of the exposure data, and supplies them to the address counter 306'. Then, the address counter 306' outputs a first pattern address based on the first pattern starting address and the first quantity information, and supplies it to the buffer memory (PD) 312'. Moreover, the output buffer 316' supplies the first pattern address output from the address counter 306' to the expect memory 322'. The expect memory control section 328' causes the first pattern address to be written to the expect memory 322' while the address counter 306' is outputting the first pattern address. Then, the expect memory 322' stores the first pattern address output from the address counter 306' based on the first main address.

Then, the buffer memory (PD) 312' receives the first pattern address, which is an example of the control signal for exposing the band area 204a' shown in FIG. 7, from the address counter 306', outputs first pattern data, which is an examples of the exposure data, and supplies it to the individual control section 170a'. Moreover, the output buffer 318' supplies the first pattern data output from the buffer memory (PD) 312' to the expect memory 324'. The expect memory control section 330' causes the first pattern data to be written to the expect memory 324' while the buffer memory (PD) 312' is outputting the first pattern data. Then, the expect memory 324' stores the first pattern data output from the buffer memory (PD) 312' based on the first pattern address. Then, the exposure section 150a' exposes the band area 204a' based on the first main data and the first pattern data which are supplied to the individual control section 170a'.

Next, the buffer memory (main) 308' receives a second main address, which is an example of the control signal for exposing the band area 204b' shown in FIG. 7 from the address counter 304', outputs second main data, which is an example of the exposure data, and supplies it to the individual control section 170a'. In addition, the band area 204b' is an area where the same exposure pattern as the band area 204a' is to be written, and the first main address and the second main address are ideally the same as each other. The expect memory control section 326' causes the comparing section 332' to read the first main data from the expect memory 320' while the buffer memory (main) 308' is outputting the second main data.

Then, the comparing section 332 compares the second main data output from the buffer memory (main) 308' with the first main data output from the expect memory 320'. That is, the comparing section 332' compares the first main data output from the buffer memory (main) 308' based on the first main address with the second main data output from the buffer memory (main) 308' based on the second main address. Then, the comparing section 332' supplies information indicating whether the first main data and the second main data are the same as each other to the comparison result storing section 337' as the comparison result. Then, the comparison result storing section 337' stores the comparison result acquired from the comparing section 332', in association with the identification information on the band area 204b', e.g., the identification information on the chip area 200b'.

Moreover, the buffer memory (PA) 310' receives the second main address from the address counter 304', outputs a second pattern starting address and second quantity information, which are examples of the exposure data, and supplies them to the address counter 306'. Then, the address counter 306' outputs a second pattern address based on the second pattern starting address and the second quantity information, and supplies it to the buffer memory (PD) 312'. The expect memory control section 328' causes the comparing section 334' to read the first pattern address from the expect memory 322' while the buffer memory (PA) 310' is outputting the second pattern starting address and the second quantity information, i.e., while the address counter 306' is outputting the second pattern address.

Then, the comparing section 334' compares the second pattern address output from the address counter 306' with the first pattern address output from the expect memory 322'. That is, the comparing section 334' compares the first pattern address output from the address counter 306' based on the first main address with the second pattern address output from the address counter 306' based on the second main address. Then, the comparing section 334' supplies information indicating whether the first pattern address and the second pattern address are the same as each other to the comparison result storing section 337' as the comparison result. Then, the comparison result storing section 337' stores the comparison result acquired from the comparing section 334', in association with the identification information on the band area 204b'.

Next, the buffer memory (PD) 312' receives the second pattern address, which is an example of the control signal for exposing the band area 204b' shown in FIG. 7, from the address counter 306', outputs second pattern data, which is an example of the exposure data, and supplies it to the individual control section 170a'. The expect memory control section 330' causes the comparing section 336' to read the first pattern data from the expect memory 324' while the buffer memory (PD) 312' is outputting the second pattern data.

Then, the comparing section 336' compares the second pattern data output from the buffer memory (PD) 312' with the first pattern data output from the expect memory 324'. That is, the comparing section 336' compares the first pattern data output from the buffer memory (PD) 312' based on the first pattern address with the second pattern data output from the buffer memory (PD) 312' based on the second pattern address. Then, the comparing section 336' supplies information indicating whether the first pattern data and the second pattern data are the same as each other to the comparison result storing section 337' as the comparison result. Then, the comparison result storing section 337' stores the comparison result acquired from the comparing section 334', in association with the identification information on the band area 204b'. Then, the exposure section 150a' exposes the band area 204b' based on the second main data and the second pattern data which are supplied to the individual control section 170a'.

Next, the buffer memory (main) 308' receives a third main address, which is an example of the control signal for exposing the band area 204c' shown in FIG. 7 from the address counter 304', outputs third main data, which is an example of the exposure data, and supplies it to the individual control section 170a'. In addition, the band area 204c' is an area where the same exposure pattern as the band area 204a' is to be written, and the first main address and the third main address are ideally the same as each other. The expect memory control section 326' causes the comparing section 332' to read the first main data from the expect memory 320' while the buffer memory (main) 308' is outputting the third main data.

Then, the comparing section 332' compares the third main data output from the buffer memory (main) 308' with the first main data output from the expect memory 320'. That is, the comparing section 332' compares the first main data output from the buffer memory (main) 308' based on the first main address with the third main data output from the buffer memory (main) 308' based on the third main address. Then, the comparing section 332' supplies the comparison result indicating whether the first main data and the third main data are the same as each other to the comparison result storing section 337' as the comparison result. Then, the comparison result storing section 337' stores the comparison result acquired from the comparing section 332', in association with the identification information on the band area 204c', e.g., the identification information on the chip area 200c'.

Moreover, the buffer memory (PA) 310' receives the third main address from the address counter 304', outputs a third pattern starting address and third quantity information, which are examples of the exposure data, and supplies them to the address counter 306'. Then, the address counter 306' outputs the third pattern address based on the third pattern starting address and the third quantity information, and supplies it to the buffer memory (PD) 312'. The expect memory control section 328' causes the comparing section 334' to read a first pattern address from the expect memory 322' while the buffer memory (PA) 310' is outputting the third pattern starting address and the third quantity information, i.e., while the address counter 306' is outputting the third pattern address.

Then, the comparing section 334' compares the third pattern address output from the address counter 306 with the first pattern address output from the expect memory 322'. That is, the comparing section 334' compares the first pattern address output from the address counter 306' based on the first main address with the third pattern address output from the address counter 306' based on the third main address. Then, the comparing section 334' supplies information indicating whether the first pattern address and the third pattern address are the same as each other to the comparison result storing section 337' as the comparison result. Then, the comparison result storing section 337' stores the comparison result acquired from the comparing section 334', in association with the identification information on the band area 204c'.

Next, the buffer memory (PD) 312' receives the third pattern address, which is an example of the control signal for exposing the band area 204c' shown in FIG. 7, from the address counter 306', outputs third pattern data, which is an example of the exposure data, and supplies it to the individual control section 170a'. The expect memory control section 330' causes the comparing section 336' to read the first pattern data from the expect memory 324 while the buffer memory (PD) 312' is outputting the third pattern data.

Then, the comparing section 336' compares the third pattern data output from the buffer memory (PD) 312' with the first pattern data output from the expect memory 324'. That is, the comparing section 336' compares the first pattern data output from the buffer memory (PD) 312' based on the first pattern address with the third pattern data output from the buffer memory (PD) 312' based on the third pattern address. Then, the comparing section 336' supplies information indicating whether the first pattern data and the third pattern data are the same as each other to the comparison result storing section 337' as the comparison result. Then, the comparison result storing section 337' stores the comparison result acquired from the comparing section 334', in association with the identification information on the band area 204c'. Then, the exposure section 150a' exposes the band area 204c' based on the third main data and the third pattern data which are supplied to the individual control section 170a'.

The error detection section 338' detects the error of the exposure pattern formed to the wafer 64' based on the comparison results of the comparing sections 332', 334' and 336' stored in the comparison result storing section 337'. Then, in case that the first main data and the second main data are the same as each other and the first main data differs from the third main data, or the first pattern address and the second pattern address are the same as each other and the first pattern address differs from the third pattern address, or the first pattern data and the second pattern data are the same as each other and the first pattern data differs from the third pattern data, the error detection section 338' judges that there is an error in the exposure pattern formed to the band area 204c', and notifies it to the integrated control section 300'.

Moreover, in case that the first main data differs from the second main data and the first main data differs from the third main data, or the first pattern address differs from the second pattern address and the first pattern address differs from the third pattern address, or the first pattern data differs from the second pattern data and the first pattern data differs from the third pattern data, the error detection section 338' judges that there is an error in the exposure pattern formed to the band area 204a', and notifies to the integrated control section 300'.

Next, after the exposure processing on the frame area 202a' shown in FIG. 6, the exposure processing on the frame area 202b' will be performed. While the wafer stage 62' is moving in the first direction (positive direction of y-axis), exposure section 150a' exposes the frame area 202a'. Then, the wafer stage 62' begins to move in the second direction (negative direction of y-axis) opposite from the first direction. Then, while the wafer stage 62' is moving in the second direction (negative direction of y-axis), the exposure section 150a' exposes the frame area 202b' adjoining the frame 202a'. The expect memory 320' erases the first memory data having been stored when the wafer stage 64' changes the moving direction.

Then, the expect memory 320' reads the main data output from the buffer memory (main) 308' based on the main address for exposing the first band area of the frame area 202b'. Then, the error of the exposure pattern of the band area in the frame area 202b' is also detected while exposing frame area 202b' as the similar manner to the above-described exposure processing of the frame area 202a'.

Since the lateral length of the frame area is the peak swing of the main deflector 56', each of the patterns written to one of the frame areas is different from one another. Even in such a case, when the wafer stage 62' changes the moving directions, i.e., when the exposed frame areas changes, the error of the exposure pattern of each frame is appropriately detectable for each band area by updating the main data stored in the expect memory 320'.

Moreover, it is preferable that the error detection processing by the error detection section 338' described above is performed during the exposure processing, so that the error of the exposure pattern is detectable without decreasing the throughput of the electron beam exposure apparatus 100', although it may be performed after the exposure processing.

According to the electron beam exposure apparatus 100' of the present embodiment, since the error detection of the exposure pattern is performed for each of the band areas, the chip, of which the exposure pattern has an error, is detectable. That is, since an area for the detection of the abnormal part is miniaturized, the yield rate is improved. Moreover, since the data which has been stored in the expect memory is compared with the data output from the buffer memory, not only data skipping, data missing, bit error etc. but also abnormal sequential order or the like is detectable.

Figure 9:
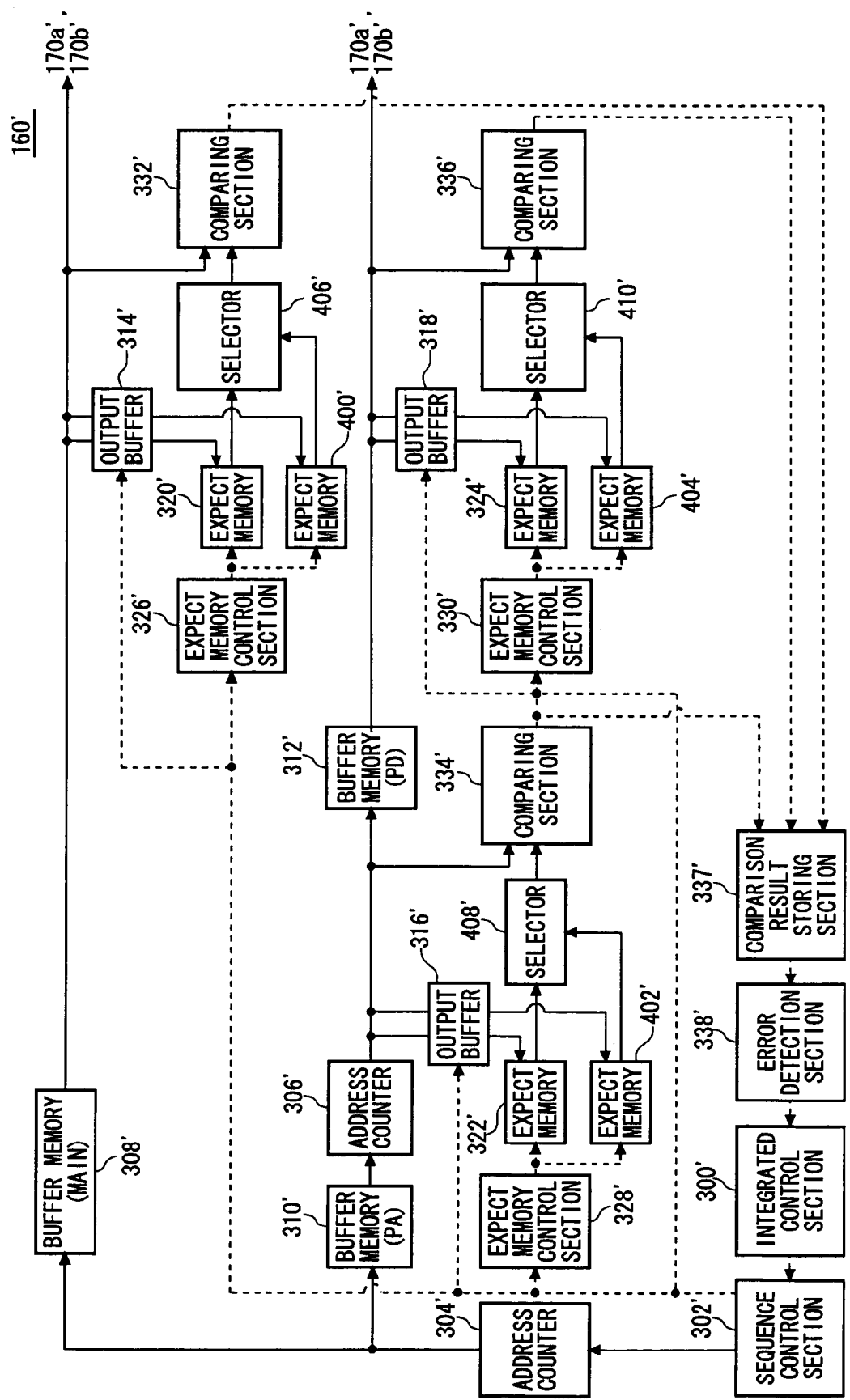
FIG. 9 is a block diagram showing a first alternative of a common processing section.

FIG. 9 is a block diagram showing a first alternative of the common processing section 160' according to the present embodiment. In addition to the components shown in FIG. 8, the common processing section 160' according to the present alternative includes expect memories 400', 402' and 404' and selectors 406', 408' and 410'. In addition, in the present alternative, a component similar to that of the common processing section 160' shown in FIG. 8 bears the same reference numeral as the common processing section shown in FIG. 8, and function and operation of the components which bear the identical reference numerals are the same as each other unless it is specified with the below explanation.

The output buffer 314' switches whether to supply the main data, which is output from the buffer memory (main) 308', to either the expect memory 320' or the expect memory 400' based on control of the sequence control section 302'. The expect memory control section 326' controls read/write of the expect memory 320' and the expect memory 400' (read control and write control) by supplying a read signal and a write signal based on the control of the sequence control section 302'. The selector 406' selects either the main data output from the expect memory 320' or the main data output from the expect memory 400', and supplies it to the comparing section 332'. The comparing section 332' compares the main data output from the buffer memory (main) 308' with the main data output from the expect memory 320' or the expect memory 400' bit by bit.

The output buffer 316' switches whether to supply the pattern address, which is output from the address counter 306', to either the expect memory 322' or the expect memory 402' based on control of the sequence control section 302. The expect memory control section 328' controls read/write of the expect memory 322' and the expect memory 402' (read control and write control) by supplying a read signal and a write signal based on the control of the sequence control section 302'. The selector 408' selects either the pattern address output from the expect memory 322' or the pattern address output from the expect memory 402', and supplies it to the comparing section 334'. The comparing section 334' compares the pattern address output from the address counter 306' with the pattern address output from the expect memory 322' or the expect memory 402' bit by bit.

The output buffer 318' switches whether to supply the pattern data, which is output from the buffer memory (PD) 312', to either the expect memory 324' or the expect memory 404' based on control of the sequence control section 302'. The expect memory control section 330' controls read/write of the expect memory 324' and the expect memory 404' (read control and write control) by supplying a read signal and a write signal based on the control of the sequence control section 302'. The selector 410' selects either the pattern data output from the expect memory 324' or the pattern data output from the expect memory 404', and supplies it to the comparing section 336'. The comparing section 336' compares the pattern data output from the buffer memory (PD) 312' with the pattern data output from the expect memory 324' or the expect memory 404' bit by bit.

Referring to FIGS. 6 and 7, operation of the common processing section 160' shown in FIG. 9, especially a pattern error detection method, will be explained specifically hereinafter. First, the exposure processing of the frame area 202a' shown in FIG. 6 is started. The buffer memory (main) 308' receives the first main address, which is an example of the control signal for exposing the band area 204a' shown in FIG. 7, from the address counter 304', outputs the first main data, and supplies it to the individual control section 170a'. At this time, the output buffer 314' supplies the first main data output from the buffer memory (main) 308' to the expect memory 320'. The expect memory control section 326' causes the first main data to be written to the expect memory 320' while the buffer memory (main) 308' is outputting the first main data. Then, the expect memory 320' stores the first main data output from the buffer memory (main) 308' based on the first main address.

Moreover, the buffer memory (PA) 310' receives the first main address, which is an example of the control signal for exposing the band area 204a' shown in FIG. 7, from the address counter 304', outputs the first pattern starting address and the first quantity information, and supplies them to the address counter 306'. Then, the address counter 306' outputs the first pattern address based on the first pattern starting address and the first quantity information, and supplies it to the buffer memory (PD) 312'. At this time, the output buffer 316' supplies the first pattern address output from the address counter 306' to the expect memory 322'. The expect memory control section 328' causes the first pattern address to be written to the expect memory 322' while the address counter 306' is outputting the first pattern address. Then, the expect memory 322' stores the first pattern address output from the address counter 306' based on the first main address.

Then, the buffer memory (PD) 312' receives the first pattern address, which is an example of the control signal for exposing the band area 204a' shown in FIG. 7, from the address counter 306', outputs the first pattern data, and supplies it to the individual control section 170a'. At this time, the output buffer 318' supplies the first pattern data output from the buffer memory (PD) 312' to the expect memory 324'. The expect memory control section 330' causes the first pattern data to be written to the expect memory 324' while the buffer memory (PD) 312' is outputting the first pattern data. Then, the expect memory 324' stores the first pattern data output from the buffer memory (PD) 312' based on the first pattern address. Then, the exposure section 150a' exposes the band area 204a' based on the first main data and the first pattern data which are supplied to the individual control section 170a'.

Next, the buffer memory (main) 308' receives the second main address, which is an example of the control signal for exposing the band area 204b' shown in FIG. 7, from the address counter 304', outputs the second main data, and supplies it to the individual control section 170*a*'. At this time, the output buffer 314' supplies the second main data output from the buffer memory (main) 308' to the expect memory 400'. The expect memory control section 326' causes the second main data to be written to the expect memory 400' while the buffer memory (main) 308' is outputting the second main data. Then, the expect memory 400' stores the second main data output from the buffer memory (main) 308' based on the second main address. Moreover, the expect memory control section 326' causes the comparing section 332' to read the first main data from the expect memory 320' while the buffer memory (main) 308' is outputting the second main data. Then, the comparing section 332' compares the second main data output from the buffer memory (main) 308' with the first main data output from the expect memory 320'. That is, the comparing section 332' compares the first main data output from the buffer memory (main) 308' based on the first main address with the second main data output from the buffer memory (main) 308' based on the second main address. Then, the comparing section 332' supplies information indicating whether the first main data and the second main data are the same as each other to the comparison result storing section 337' as the comparison result. Then, the comparison result storing section 337' stores the comparison result acquired from the comparing section 332', in association with the identification information on the band area 204*b*'.

Moreover, the buffer memory (PA) 310' receives the second main address, which is an example of the control signal for exposing the band area 204*b*' shown in FIG. 7, from the address counter 304', outputs the second pattern starting address and the second quantity information, and supplies them to the address counter 306'. Then, the address counter 306' outputs the second pattern address based on the second pattern starting address and the second quantity information, and supplies it to the buffer memory (PD) 312'. At this time, the output buffer 316' supplies the second pattern starting address and the second quantity information output from the address counter 306' to the expect memory 402'. The expect memory control section 328' causes the second pattern address to be written to the expect memory 402' while the address counter 306' is outputting the second pattern address.

Then, the expect memory 402' stores the second pattern address output from the address counter 306' based on the second main address. Moreover, the expect memory control section 328' causes the comparing section 334' to read the first pattern address from the expect memory 322' while the buffer memory (PA) 310' is outputting the second pattern starting address and the second quantity information, i.e., while the address counter 306' is outputting the second pattern address.

Then, the comparing section 334' compares the second pattern address output from the address counter 306' with the first pattern address output from the expect memory 322'. That is, the comparing section 334' compares the first pattern address output from the address counter 306' based on the first main address with the second pattern address output from the address counter 306' based on the second main address. Then, the comparing section 334' supplies information indicating whether the first main data and the second main data are the same as each other to the comparison result storing section 337' as the comparison result. Then, the comparison result storing section 337' stores the comparison result acquired from the comparing section 334', in association with the identification information on the band area 204*b*'.

Then, the buffer memory (PD) 312' receives the second pattern address, which is an example of the control signal for exposing the band area 204*b*' shown in FIG. 7, from the address counter 306', outputs the second pattern data, and supplies it to the individual control section 170*a*'. At this time, the output buffer 318' supplies the second pattern data output from the buffer memory (PD) 312 to the expect memory 404'. The expect memory control section 330' causes the second pattern data to be written to the expect memory 404' while the buffer memory (PD) 312' is outputting the second pattern data.

Then, the expect memory 404' stores the second pattern data output from the buffer memory (PD) 312' based on the second pattern address. Moreover, the expect memory control section 330' causes the comparing section 336' to read the first pattern data from the expect memory 324' while the buffer memory (PD) 312' is outputting the second pattern data.

Then, the comparing section 336' compares the second pattern data output from the buffer memory (PD) 312' with the first pattern data output from the expect memory 324'. That is, the comparing section 336' compares the first pattern data output from the buffer memory (PD) 312' based on the first pattern address with the second pattern data output from the buffer memory (PD) 312' based on the second pattern address. Then, the comparing section 336' supplies information indicating whether the first pattern data and the second pattern data are the same as each other to the comparison result storing section 337' as the comparison result. Then, the comparison result storing section 337' stores the comparison result acquired from the comparing section 334', in association with the identification information on the band area 204*b*'. Then, the exposure section 150*a*' exposes the band area 204*b*' based on the second main data and the second pattern data which are supplied to the individual control section 170*a*'.

Next, the buffer memory (main) 308' receives the third main address, which is an example of the control signal for exposing the band area 204*c*' shown in FIG. 7, from the address counter 304', outputs the third main data, and supplies it to the individual control section 170*a*'. At this time, the output buffer 314' supplies the third main data output from the buffer memory (main) 308' to the expect memory 320'. The expect memory control section 326' causes the third main data to be written to the expect memory 320' while the buffer memory (main) 308 is outputting the third main data.

Then, the expect memory 320' stores the third main data output from the buffer memory (main) 308' based on the third main address. Moreover, the expect memory control section 326' causes the comparing section 332' to read the second main data from the expect memory 400' while the buffer memory (main) 308' is outputting the third main data. Then, the comparing section 332' compares the third main data output from the buffer memory (main) 308' with the second main data output from the expect memory 400'. That is, the comparing section 332' compares the second main data output from the buffer memory (main) 308' based on the second main address with the third main data output from the buffer memory (main) 308' based on the third main address. Then, the comparing section 332' supplies information indicating whether the second main data and the third main data are the same as each other to the comparison result storing section 337' as the comparison result. Then, the comparison result storing section 337' stores the comparison result acquired from the comparing section 334', in association with the identification information on the band area 204c'.

Moreover, the buffer memory (PA) 310' receives the third main address, which is an example of the control signal for exposing the band area 204c' shown in FIG. 7, from the address counter 304', outputs the third pattern starting address and third quantity information, and supplies them to the address counter 306'. Then, the address counter 306' outputs the third pattern address based on the third pattern starting address and the third quantity information, and supplies it to the buffer memory (PD) 312'. At this time, the output buffer 316' supplies the third pattern address output from the address counter 306' to the expect memory 322'. The expect memory control section 328' causes the third pattern address to be written to the expect memory 322' while the address counter 306' is outputting the third pattern address.

Then, the expect memory 322' stores the third pattern address output from the address counter 306' based on the third main address. Moreover, the expect memory control section 328' causes the comparing section 334' to read the second pattern address from the expect memory 402' while the buffer memory (PA) 310' is outputting the third pattern starting address and the third quantity information. Then, the comparing section 334' compares the third pattern address output from the address counter 306' with the second pattern address output from the expect memory 402'. That is, the comparing section 334' compares the second pattern address output from the address counter 306' based on the second main address with the third pattern address output from the address counter 306' based on the third main address. Then, the comparing section 334' supplies information indicating whether the second pattern address and the third pattern address are the same as each other to the comparison result storing section 337' as the comparison result. Then, the comparison result storing section 337' stores the comparison result acquired from the comparing section 334', in association with the identification information on the band area 204c'.

Then, the buffer memory (PD) 312' receives the third pattern address, which is an example of the control signal for exposing the band area 204c' shown in FIG. 7, from the address counter 306', outputs the third pattern data, and supplies it to the individual control section 170a'. At this time, the output buffer 318' supplies third pattern data output from the buffer memory (PD) 312' to the expect memory 324'. The expect memory control section 330' causes the third pattern data to be written to the expect memory 324' while the buffer memory (PD) 312' is outputting the third pattern data. Then, the expect memory 324' stores the third pattern data output from the buffer memory (PD) 312' based on the third pattern address. Moreover, the expect memory control section 330' causes the comparing section 336' to read the second pattern data from the expect memory 404' while the buffer memory (PD) 312' is outputting the third pattern data.

Then, the comparing section 336' compares the third pattern data output from the buffer memory (PD) 312' with the second pattern data output from the expect memory 404'. That is, the comparing section 336' compares the second pattern data output from the buffer memory (PD) 312' based on the second pattern address with the third pattern data output from the buffer memory (PD) 312' based on the third pattern address. Then, the comparing section 336' supplies information indicating whether the second pattern data and the third pattern data are the same as each other to the comparison result storing section 337' as the comparison result. Then, the comparison result storing section 337' stores the comparison result acquired from the comparing section 336', in association with the identification information on the band area 204c'. Then, the exposure section 150a' exposes the band area 204c' based on the third main data and the third pattern data which are supplied to the individual control section 170a'.

In case that the first main data and the second main data are the same as each other and the second main data differs from the third main data, or the first pattern address and the second pattern address are the same as each other and the second pattern address differs from the third pattern address, or the first pattern data and the second pattern data are the same as each other and the second pattern data differs from the third pattern data, the error detection section 338' judges that there is an error in the exposure pattern formed to the band area 204c', and notifies it to the integrated control section 300'.

Moreover, in case that the first main data differs from the second main data and the second main data differs from the third main data, or the first pattern address differs from the second pattern address and the second pattern address differs from the third pattern address, or the first pattern data differs from the second pattern data and the second pattern data differs from the third pattern data, the error detection section 338' judges that there is an error in the exposure pattern formed to the band area 204b', and notifies it to the integrated control section 300'.

Moreover, in case that the first main data differs from the second main data and the second main data and the third main data are the same as each other, or the first pattern address differs from the second pattern address and the second pattern address and the third pattern address are the same as each other, or the first pattern data differs from the second pattern data and the second pattern data and the third pattern data are the same as each other, the error detection section 338' judges that there is an error in the exposure pattern formed to the band area 204a', and notifies it to the integrated control section 300'.

According to the pattern error detection method according to the present alternative, since the exposure data for exposing one band area is compared with two exposure data for exposing the other two band areas, respectively, the error of the exposure pattern is correctly detectable.

Figure 10:
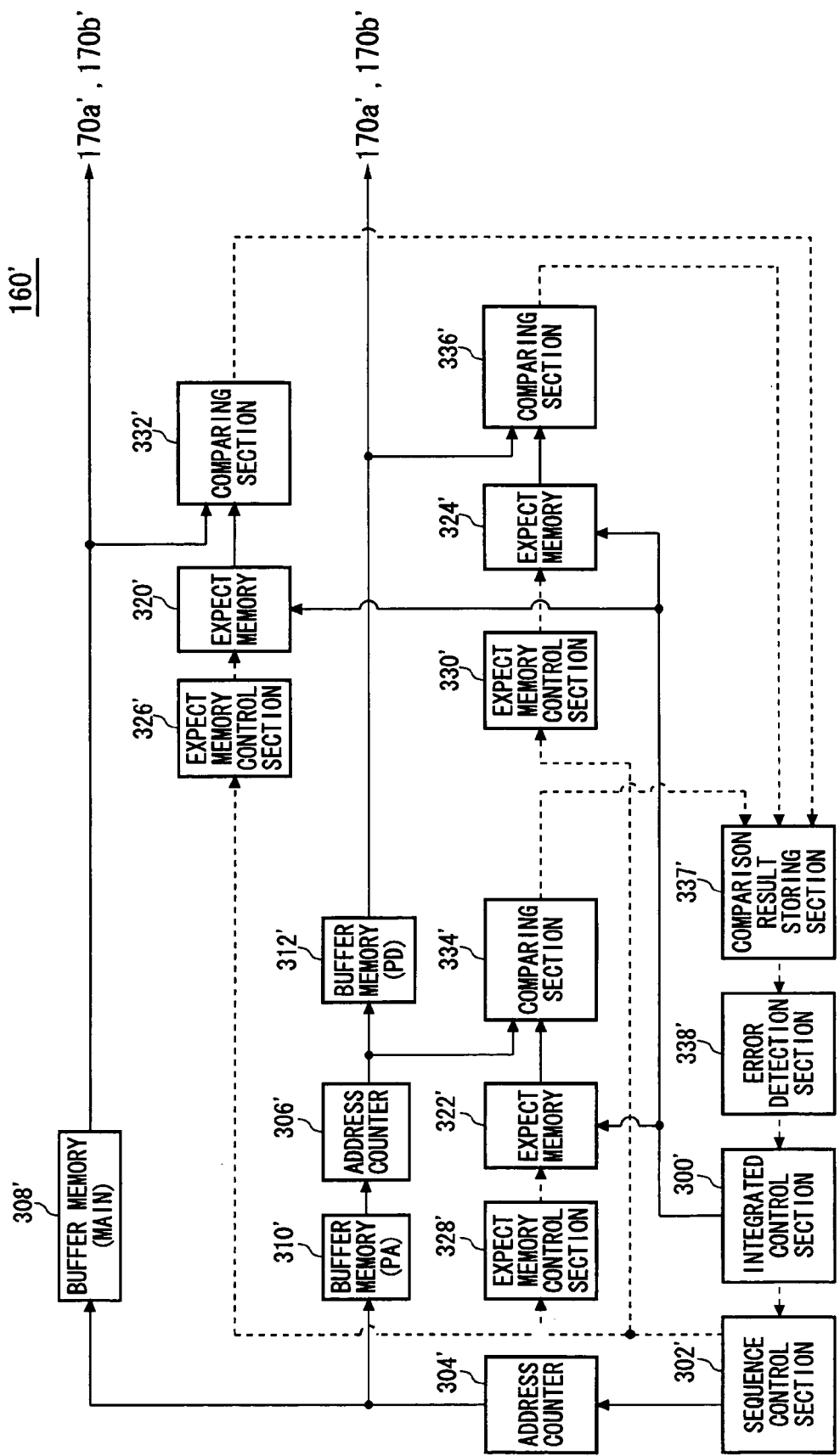
FIG. 10 is a block diagram showing a second alternative of the common processing section.

FIG. 10 is a block diagram showing a second alternative of the common processing section 160' according to the present embodiment. In addition, in the present alternative, a component similar to that of the common processing section 160' shown in FIG. 8 bears the same reference numeral as the common processing section shown in FIG. 8, and function and operation of the components which bear the identical reference numerals are the same as each other unless it is specified with the below explanation.

The integrated control section 300' is an example of an expect data generating section of the present invention, and generates expect data, which is an expected value of the main data to be output from the buffer memory (main) 308' based on the main address, expect data which is an expected value of the pattern address to be output from the address counter 306' based on the main address, and expect data which is an expected values of the pattern data to be output from the buffer memory (PD) 312' based on the pattern address. Then, the expect memories 320', 322', and 324' receive and store the expect data generated by the integrated control section 300' through a system bus.

Referring to FIGS. 6 and 7, operation of the common processing section 160' shown in FIG. 10, especially a pattern error detection method, will be explained specifically hereinafter. First, the integrated control section 300' generates a first main expect data, which is the expected values of the first main data to be output from the buffer memory (main) 308' based on the first main address, which is an example of the control signal for exposing the band area in the frame area 202a' shown in FIG. 6, and supplies it to the expect memory 320'. Then, the expect memory 320' stores the first main expect data generated by the integrated control section 300'.

Moreover, the integrated control section 300' generates a first pattern address expect data, which is the expected values of the first pattern address to be output from the address counter 306' based on the first main address, and supplies it to the expect memory 322'. Then, the expect memory 322' stores the first pattern address expect data generated by the integrated control section 300'. Moreover, the integrated control section 300' generates a first pattern expect data, which is the expected values of the first pattern data to be output from the buffer memory (PD) 312' based on the first pattern address, and supplies it to the expect memory 324'. Then, the expect memory 324' stores the first pattern expect data generated by the integrated control section 300'.

Next, the exposure processing of the frame area 202a' shown in FIG. 6 will be started. The wafer stage 62' moves in the first direction (positive direction of y-axis), and while the wafer stage 62' is moving in the first direction (positive direction of y-axis), the exposure section 150a' exposes the frame area 202a' (first exposure processing).

Next, the buffer memory (main) 308' receives the first main address, which is an example of the control signal for exposing the band area 204a' shown in FIG. 7, from the address counter 304', outputs the first main data, and supplies it to the comparing section 332' and the individual control section 170a'. The expect memory control section 326' causes the comparing section 332' to read the first main expect data from the expect memory 320' while the buffer memory (main) 308' is outputting the first main data.

Then, the comparing section 332' compares the first main data output from the buffer memory (main) 308' with the first main expect data output from the expect memory 320'. Then, the comparing section 332' supplies information indicating whether the first main data and the first main expect data are the same as each other to the comparison result storing section 337' as the comparison result. Then, the comparison result storing section 337' stores the comparison result acquired from the comparing section 334', in association with the identification information on the band area 204a'.

Moreover, the buffer memory (PA) 310' receives the first main address, which is an example of the control signal for exposing the band area 204a' shown in FIG. 7, from the address counter 304', outputs the first pattern starting address and the first quantity information, and supplies them to the address counter 306'. Then, the address counter 306' outputs the first pattern address based on the first pattern starting address and the first quantity information, and supplies it to the comparing section 334' and the buffer memory (PD) 312'. The expect memory control section 328' causes the comparing section 334' to read the first pattern address expect data from the expect memory 322' while the buffer memory (PA) 310' is outputting the first pattern starting address and the first quantity information, i.e., while the address counter 306' is outputting the first pattern address.

Then, the comparing section 334' compares the first pattern address output from the address counter 306' with the first pattern address expect data output from the expect memory 322'. Then, the comparing section 334' supplies information indicating whether the first pattern address and the first pattern address expect data are the same as each other to the comparison result storing section 337' as the comparison result. Then, the comparison result storing section 337' stores the comparison result acquired from the comparing section 334', in association with the identification information on the band area 204a'.

Then, the buffer memory (PD) 312' receives the first pattern address, which is an example of the control signal for exposing the band area 204a' shown in FIG. 7, from the address counter 306', outputs the first pattern data, and supplies it to the comparing section 336' and the individual control section 170a'. Moreover, the expect memory control section 330' causes the comparing section 336' to read the first pattern expect data from the expect memory 324' while the buffer memory (PD) 312' is outputting the first pattern data.

Then, the comparing section 336' compares the first pattern data output from the buffer memory (PD) 312' with the first pattern expect data output from the expect memory 324'. Then, the comparing section 336' supplies information indicating whether the first pattern data and the first pattern expect data are the same as each other to the comparison result storing section 337' as the comparison result. Then, the comparison result storing section 337' stores the comparison result acquired from the comparing section 334', in association with the identification information on the band area 204a'. Then, the exposure section 150a' exposes the band area 204a' based on the second main data and the second pattern data which are supplied to the individual control section 170a'. Then, the band areas 204b' and 204c' are exposed by repeating the above-described comparison processing.

Next, after the frame area 202a' shown in FIG. 6 has been exposed, the exposure processing on the frame area 202b' will be performed. After the wafer stage 62' has moved in the first direction (positive direction of y-axis), the wafer stage 62' begins to move in the second direction (negative direction of y-axis) opposite from the first direction (positive direction of y-axis). Then, while the wafer stage 62' is moving in the second direction (negative direction of y-axis), the exposure section 150a' exposes the frame area 202b'.

Before the second exposure processing, the integrated control section 300' generates: fourth main expect data, which is an expected value of fourth main data to be output from the buffer memory (main) 308' based on the fourth main address which is an example of the control signal for exposing the band area in the frame area 202b' shown in FIG. 6; fourth pattern address expect data, which is an expected value of a fourth pattern address to be output from the address counter 306' based on the fourth main address; and fourth pattern expect data, which is the expected values of fourth pattern data to be output from the buffer memory (PD) 312' based on the fourth pattern address. Then, between the first exposure processing and the second exposure processing, the fourth main expect data is supplied to the expect memory 320', the fourth pattern address expect data is supplied to the expect memory 322', and the fourth pattern expect data is supplied to the expect memory 324'. Then, between the first exposure processing and the second exposure processing, the expect memories 320', 322', and 324' read the fourth main expect data, the fourth pattern address expect data, and the fourth pattern expect data generated by the integrated control section 300', respectively. Then, the exposure processing of the frame area 202b' is started.

Figure 11:
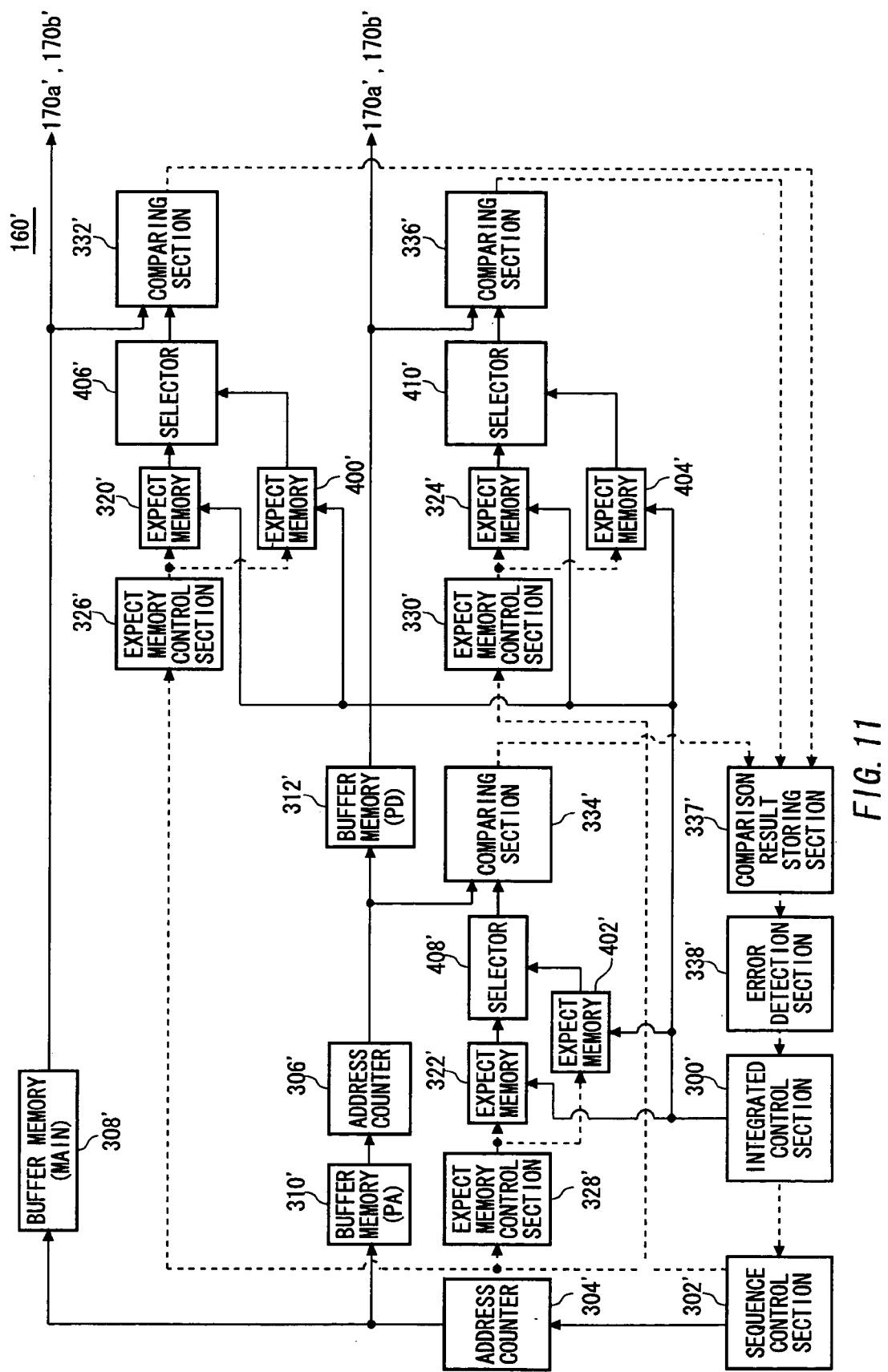
FIG. 11 is a block diagram showing a third alternative of the common processing section.

FIG. 11 is a block diagram showing a third alternative of the common processing section 160' according to the present embodiment. In addition to the components shown in FIG. 10, the common processing section 160' according to the present alternative includes the expect memories 400', 402' and 404' and the selectors 406', 408' and 410'. In addition, in the present alternative, a component similar to that of the common processing section 160' shown in FIG. 10 bears the same reference numeral as the common processing section shown in FIG. 10, and function and operation of the components which bear the identical reference numerals are the same as each other unless it is specified with the below explanation.

The expect memories 400', 402', and 404' receive and store the expect data generated by the integrated control section 300' through a system bus in a similar manner to the expect memories 320', 322', and 324'.

The expect memory control section 326' controls read/write of the expect memory 320' and the expect memory 400' (read control and write control) by supplying a read signal and a write signal based on the control of the sequence control section 302'. The selector 406' selects either the expect data output from the expect memory 320' or the expect data output from the expect memory 400', and supplies it to the comparing section 332'. The comparing section 332' compares the main data output from the buffer memory (main) 308' with the expect data output from the expect memory 320' or 400' bit by bit.

Moreover, the expect memory control section 328' controls read/write of the expect memory 322' and the expect memory 402' (read control and write control) by supplying a read signal and a write signal based on the control of the sequence control section 302'. The selector 408' selects either the expect data output from the expect memory 322' or the expect data output from the expect memory 402', and supplies it to the comparing section 334'. The comparing section 334' compares the pattern address output from the address counter 306' with the expect data output from the expect memory 322' or 402' bit by bit.

Moreover, the expect memory control section 330' controls read/write of the expect memory 324' and the expect memory 404' (read control and write control) by supplying a read signal and a write signal based on the control of the sequence control section 302'. The selector 410' selects either the expect data output from the expect memory 324' or the expect data output from the expect memory 404', and supplies it to the comparing section 336'. The comparing section 336' compares the pattern data output from the buffer memory (PD) 312' with the expect data output from the expect memory 324' or 404' bit by bit.

Referring to FIGS. 6 and 7, operation of the common processing section 160' shown in FIG. 11, especially a pattern error detection method, will be explained specifically hereinafter. First, the integrated control section 300' generates the first main expect data, which is the expected values of the first main data to be output from the buffer memory (main) 308' based on the first main address which is an example of the control signal for exposing the band area in the frame area 202a' shown in FIG. 6, and supplies it to the expect memory 320'. Then, the expect memory 320' stores the first main expect data generated by the integrated control section 300'. Moreover, the integrated control section 300' generates the first pattern address expect data, which is the expected values of the first pattern address to be output from the address counter 306' based on the first main address, and supplies it to the expect memory 322'. Then, the expect memory 322' stores the first pattern address expect data generated by the integrated control section 300'. Moreover, the integrated control section 300' generates the first pattern expect data, which is the expected values of the first pattern data to be output from the buffer memory (PD) 312' based on the first pattern address, and supplies it to the expect memory 324'. Then, the expect memory 324' stores the first pattern expect data generated by the integrated control section 300'.

Next, the exposure processing of the frame area 202a' shown in FIG. 6 will be started. The wafer stage 62' moves in the first direction (positive direction of y-axis), and while the wafer stage 62' is moving in the first direction (positive direction of y-axis), the exposure section 150a' exposes the frame area 202a' (first exposure processing).

The buffer memory (main) 308' receives the first main address from the address counter 304', outputs the first main data, and supplies it to the comparing section 332' and the individual control section 170a'. The expect memory control section 326' causes the comparing section 332' to read the first main expect data from the expect memory 320' while the buffer memory (main) 308' is outputting the first main data.

Then, the comparing section 332' compares the first main data output from the buffer memory (main) 308' with the first main expect data output from the expect memory 320'. Then, the comparing section 332' supplies information indicating whether the first main data and the first main expect data are the same as each other to the comparison result storing section 337' as the comparison result. Then, the comparison result storing section 337' stores the comparison result acquired from the comparing section 332', in association with the identification information on the band area 204a'.

Moreover, the buffer memory (PA) 310' receives the first main address from the address counter 304', outputs the first pattern starting address and the first quantity information, and supplies them to the address counter 306'. Then, the address counter 306' outputs the first pattern address based on the first pattern starting address and the first quantity information, and supplies it to the buffer memory (PD) 312'. The expect memory control section 328' causes the comparing section 334' to read the first pattern address expect data from the expect memory 322' while the address counter 306' is out putting the first pattern address.

Then, the comparing section 334' compares the first pattern address output from the address counter 306' with the first pattern address expect data output from the expect memory 322'. Then, the comparing section 334' supplies information indicating whether the first pattern address and the first pattern address expect data are the same as each other to the comparison result storing section 337' as the comparison result. Then, the comparison result storing section 337' stores the comparison result acquired from the comparing section 334', in association with the identification information on the band area 204a'.

Then, the buffer memory (PD) 312' receives the first pattern address from the address counter 306', outputs the first pattern data, and supplies it to the comparing section 336' and the individual control section 170a'. The expect memory control section 330' causes the comparing section 336' to read the first pattern expect data from the expect memory 324' while the buffer memory (PD) 312' is outputting the first pattern data.

Then, the comparing section 336' compares the first pattern data output from the buffer memory (PD) 312' with the first pattern expect data output from the expect memory 324'. Then, the comparing section 336' supplies information indicating whether the first pattern data and the first pattern expect data are the same as each other to the comparison result storing section 337' as the comparison result. Then, the comparison result storing section 337' stores the comparison result acquired from the comparing section 334', in association with the identification information on the band area 204a'. Then, the exposure section 150a' exposes the band area 204a' based on the first main data and the first pattern data which are supplied to the individual control section 170a'. Then, the band areas 204b' and 204c' are exposed by repeating the above-described comparison processing.

Before the end of the first exposure processing, the integrated control section 300' generates: the fourth main expect data, which is an expected value of the fourth main data to be output from the buffer memory (main) 308' based on the fourth main address which is an example of the control signal for exposing the band area in the frame area 202b' shown in FIG. 6; the fourth pattern address expect data, which is an expected value of the fourth pattern address to be output from the address counter 306' based on the fourth main address; and the fourth pattern expect data, which is the expected values of the fourth pattern data to be output from the buffer memory (PD) 312' based on the fourth pattern address.

Then, during the first exposure processing, the fourth main expect data is supplied to the expect memory 400', the fourth pattern address expect data is supplied to the expect memory 402', and the fourth pattern expect data are supplied to the expect memory 404'. Then, during the first exposure processing, the expect memories 400', 402', and 404' read the fourth main expect data, the fourth pattern address expect data, and the fourth pattern expect data generated by the integrated control section 300', respectively.

Next, after the frame area 202a' shown in FIG. 6 has been exposed, the exposure processing on the frame area 202b' will be performed. After the wafer stage 62' has moved in the first direction (positive direction of y-axis), the wafer stage 62' begins to move in the second direction (negative direction of y-axis) opposite from the first direction (positive direction of y-axis). Then, while the wafer stage 62' is moving in the second direction (negative direction of y-axis), the exposure section 150a' exposes the frame area 202b' (second exposure processing).

Next, the buffer memory (main) 308' receives the fourth main address from the address counter 304', outputs the fourth main data, and supplies it to the comparing section 332' and the individual control section 170a'. The expect memory control section 326' causes the comparing section 332' to read the fourth main expect data from the expect memory 400' while the buffer memory (main) 308' is outputting the fourth main data. Then, the comparing section 332' compares the fourth main data output from the buffer memory (main) 308' with the fourth main expect data output from the expect memory 400'. Then, the comparing section 332' supplies information indicating whether the fourth main data and the fourth main expect data are the same as each other to the comparison result storing section 337' as the comparison result. Then, the comparison result storing section 337' stores the comparison result acquired from the comparing section 332', in association with the identification information on the band area.

Moreover, the buffer memory (PA) 310' receives the fourth main address from the address counter 304', outputs a fourth pattern starting address and fourth quantity information, and supplies them to the address counter 306'. Then, the address counter 306' outputs the fourth pattern address based on the' fourth pattern starting address and the fourth quantity information, and supplies it to the buffer memory (PD) 312'. The expect memory control section 328' causes the comparing section 334' to read the fourth pattern address expect data from the expect memory 402' while the address counter 306' is outputting the fourth pattern address.

Then, the comparing section 334' compares the fourth pattern address output from the address counter 306' with the fourth pattern address expect data output from the expect memory 402'. Then, the comparing section 334' supplies information indicating whether the fourth pattern address and the fourth pattern address expect data are the same as each other to the comparison result storing section 337' as the comparison result. Then, the comparison result storing section 337' stores the comparison result acquired from the comparing section 334', in association with the identification information on the band area.

Then, the buffer memory (PD) 312' receives the fourth pattern address from the address counter 306', outputs the fourth pattern data, and supplies it to the comparing section 336' and the individual control section 170a'. Moreover, the expect memory control section 330' causes the comparing section 336' to read the fourth pattern expect data from the expect memory 404' while the buffer memory (PD) 312' is outputting the fourth pattern data.

Then, the comparing section 336' compares the fourth pattern data output from the buffer memory (PD) 312' with the fourth pattern expect data output from the expect memory 404. Then, the comparing section 336' supplies information indicating whether the fourth pattern data and the fourth pattern expect data are the same as each other to the comparison result storing section 337' as the comparison result. Then, the comparison result storing section 337' stores the comparison result acquired from the comparing section 334', in association with the identification information on the band area. Then, the exposure section 150a' exposes the band area based on the fourth main data and the fourth pattern data which are supplied to the individual control section 170a'. Then, the band areas in the frame area 202b' are exposed by repeating the above-described comparison processing.

Before the end of the second exposure processing, the integrated control section 300' generates: fifth main expect data, which is an expected value of fifth main data to be output from the buffer memory (main) 308' based on a fifth main address which is an example of the control signal for exposing the band area in the frame area 202c' shown in FIG. 6; fifth pattern address expect data, which is an expected value of a fifth pattern address to be output from the address counter 306' based on the fifth main address; and fifth pattern expect data, which is the expected values of fifth pattern data to be output from the buffer memory (PD) 312' based on the fifth pattern address. Then, during the second exposure processing, the fifth main expect data is supplied to the expect memory 320', the fifth pattern address expect data is supplied to the expect memory 322', and the fifth pattern expect data is supplied to the expect memory 324'. Then, during the second exposure processing, the expect memories 320', 322', and 324' read the fifth main expect data, the fifth pattern address expect data, and the fifth pattern expect data generated by the integrated control section 300', respectively.

Next, after the frame area 202b' shown in FIG. 6 has been exposed, the exposure processing on the frame area 202c' will be performed. After the wafer stage 62' has moved in the second direction (negative direction of y-axis), the wafer stage 62' begins to move in the first direction (positive direction of y-axis) once again. Then, while the wafer stage 62' is moving in the first direction (positive direction of y-axis), the exposure section 150a' exposes the frame area 202c' (third exposure processing).

In the third exposure processing, the common processing section 160' performs the same processing as the first exposure processing using the fifth main expect data, the fifth pattern address expect data, and the fifth pattern expect data stored on the expect memories 320', 322', and 324', respectively.

According to the pattern error detection method of the present alternative, since the expect memory is doubled and the data reading from the expect memory and the data writing to the expect memory are performed during the exposure processing, the error of the exposure pattern is detectable without decreasing the throughput of the electron beam exposure apparatus 100'.

In the present embodiment, although there has been explained the pattern error detection method for the electron beam exposure apparatus 100' exposing the wafer 64' using the OTF exposure method (continuous-stage-movement writing method), the pattern error detection method according to the present invention is applicable for the electron beam exposure apparatus 100' exposing the wafer 64' for each of the chip areas 200' one-by-one using the SR exposure method (step-and-repeat method).

Although the present invention has been described by way of exemplary embodiments, it should be understood that those skilled in the art might make many changes and substitutions without departing from the spirit and the scope of the present invention. It is obvious from the definition of the appended claims that embodiments with such modifications also belong to the scope of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electron beam exposure apparatus for exposing a wafer by an electron beam, comprising:
   a general control section for controlling the electron beam exposure apparatus collectively;
   a first buffer memory for temporarily storing exposure data, which include data of an exposure pattern to be formed on the wafer;
   a second buffer memory for temporarily storing the exposure data;
   a first exposure section for applying the electron beam to the wafer based on the exposure data output from said first buffer memory; and
   a first comparing section for comparing the exposure data output from said first buffer memory with the exposure data output from said second buffer memory, and for notifying the comparison result to said general control section;
   wherein the exposure data stored in said first buffer memory and the exposure data stored in said second buffer memory are identical to one another when no error is involved in the electron beam exposure apparatus.

2. The electron beam exposure apparatus as claimed in claim 1, wherein
   said first comparing section notifies said general control section whether the exposure data output from said first buffer memory is consistent with the exposure data output from said second buffer memory as the comparison result, and
   said general control section stores the comparison result in association with an exposure area to be exposed based on the exposure data.

3. The electron beam exposure apparatus as claimed in claim 2, further comprising:
   a second exposure section for applying an electron beam to a different wafer from the wafer based on the exposure data output from said first buffer memory;
   a first pattern generation section for generating shot data, which are the exposure data output from said first buffer memory being split into shots;
   a second pattern generation section for generating shot data, which are the exposure data output from said first buffer memory being split into shots; and
   a second comparing section for comparing the shot data output from said first pattern generation section with the shot data output from said second pattern generation section, and for notifying the comparison result to said general control section.

4. The electron beam exposure apparatus as claimed in claim 3, wherein
   said second comparing section notifies said general control section whether the shot data output from said first pattern generation section are consistent with the shot data output from said second pattern generation section as the comparison result, and
   said general control section stores the comparison result notified from said second comparing section in association with the comparison result notified from said first comparing section.

5. The electron beam exposure apparatus as claimed in claim 3, further comprising:
   a first pattern correction section for correcting the shot data output from said first pattern generation section;
   a second pattern correction section for correcting the shot data output from said second pattern generation section; and
   a third comparing section for comparing the shot data output from said first pattern correction section with the shot data output from said second pattern correction section, and for notifying the comparison result to said general control section.

6. The electron beam exposure apparatus as claimed in claim 5, wherein
   said third comparing section notifies said general control section whether the shot data output from said first pattern correction section are consistent with the shot data output from said second pattern correction section as the comparison result, and
   said general control section stores the comparison result notified from said third comparing section in association with the comparison result notified from said first comparing section.

7. The electron beam exposure apparatus as claimed in claim 1, wherein said first comparing section compares the exposure data output from said first buffer memory with the exposure data output from said second buffer memory bit by bit.

8. The electron beam exposure apparatus as claimed in claim 1, further comprising a second exposure section for applying an electron beam to a different wafer based on the exposure data output from said second buffer memory.

9. The electron beam exposure apparatus as claimed in claim 1, wherein
when the exposure data output from the first buffer memory is consistent with the exposure data output from the second buffer memory, said general control section decides that the exposure pattern formed based on the exposure data is to be inspected.

10. The electron beam exposure apparatus as claimed in claim 9, wherein
when the exposure data output from the first buffer memory is inconsistent with the exposure data output from the second buffer memory, said general control section decides that an inspection process on the exposure pattern formed based on the exposure data be omitted and proceeds to a photoresist removal process.

11. An exposure apparatus for writing a desired exposure pattern to a wafer, comprising:
a buffer memory storing thereon exposure data, which include data of an exposure pattern to be formed on the wafer;
a comparing section for comparing first exposure data output from said buffer memory based on a first control signal for exposing a first area of the wafer with second exposure data output from said buffer memory based on a second control signal for exposing a second area of the wafer where the same exposure pattern as the first area is to be written; and
an error detection section for detecting an error of the exposure pattern formed to the wafer based on the comparison result by said comparing sections;
wherein the first exposure data and the second exposure data output from said buffer memory are identical to one another when no error is involved in the electron beam exposure apparatus.

12. The exposure apparatus as claimed in claim 11, further comprising a first expect memory storing thereon the first exposure data output from said buffer memory, wherein said comparing section compares the first exposure data output from said first expect memory with the second exposure data output from said buffer memory.

13. The exposure apparatus as claimed in claim 12, further comprising a wafer stage mounting thereon the wafer for exposing the wafer while said wafer stage is moving in a first direction and then changing the direction and moving in a second direction opposite from the first direction, wherein in case that said wafer stage changes the direction, the first exposure data output from said buffer memory are written to said first expect memory.

14. The exposure apparatus as claimed in claim 12, further comprising a second expect memory storing thereon the second exposure data output from said buffer memory, wherein said comparing section compares the second exposure data output from said second expect memory with third exposure data output from said buffer memory based on a third control signal for exposing a third area of the wafer where the same exposure pattern as the first area is to be written.

15. The exposure apparatus as claimed in claim 14, further comprising:

a first expect memory control section for causing the first exposure data to be written to said first expect memory while said buffer memory is outputting the first exposure data, for causing said comparing section to read the first exposure data from said first expect memory while said buffer memory is outputting the second exposure data, and for causing the third exposure data to be written to said first expect memory while said buffer memory is outputting the third exposure data; and
a second expect memory control section for causing the second exposure data to be written to said second expect memory while said buffer memory is outputting the second exposure data, and for causing said comparing section to read the second exposure data from said second expect memory while said buffer memory is outputting the third exposure data.

16. The exposure apparatus as claimed in claim 12, wherein said comparing section compares the first exposure data output from said first expect memory with the second exposure data output from said buffer memory bit by bit.

17. The exposure apparatus as claimed in claim 12, further comprising a comparison result storing section storing thereon information indicating whether the first exposure data and the second exposure data are the same as each other as a comparison result in association with identification information on the second area, wherein said error detection section detects an error of the exposure pattern formed to the wafer based on the comparison result stored on said comparison result storing section.

18. The exposure apparatus as claimed in claim 17, wherein
said comparing section compares the first exposure data output from said first expect memory with third exposure data output from said buffer memory based on a third control signal for exposing a third area of the wafer where the same exposure pattern as the first area is to be written,
said comparison result storing section stores information indicating whether the first exposure data and the second exposure data are the same as each other, and information indicating whether the first exposure data and the third exposure data are the same as each other, as the comparison result, and
said error detection section judges that there is an error in the exposure pattern formed to the third area when the first exposure data and the second exposure data are the same as each other and the first exposure data differs from the third exposure data, and judges that there is an error in the exposure pattern formed to the first area when the first exposure data differs from the second exposure data and the first exposure data differs from the third exposure data.

19. A pattern error detection method of detecting an error of an exposure pattern formed to a wafer, comprising steps of:
exposing the wafer using first exposure data output from a buffer memory based on a first control signal for exposing a first area of the wafer;
exposing the wafer using second exposure data output from the buffer memory based on a second control signal for exposing a second area of the wafer where the same exposure pattern as the first area is to be written;
comparing the first exposure data with the second exposure data; and detecting the error of the exposure pattern formed to the wafer based on a comparison result in said comparison step;

wherein the first exposure data and the second exposure data output from said buffer memory are identical to one another when no error is involved in the electron beam exposure apparatus.

20. An exposure apparatus for writing a desired exposure pattern to a wafer, comprising:

a buffer memory storing thereon exposure data, which include data of the exposure pattern to be formed on the wafer;

an expect data generating section for generating first expect data, which is an expected value of the exposure data to be output from said buffer memory based on a first control signal for exposing a first area of the wafer;

a comparing section for comparing first exposure data output from said buffer memory based on the first control signal with the first expect data generated by said expect data generating section;

an exposure section for exposing the wafer based on the first exposure data output from said buffer memory; and an error detection section for detecting an error of an exposure pattern formed to the wafer based on a comparison result by said comparing section wherein the first exposure data stored in said buffer memory and the first expect data generated by said expect data generating section are identical to one another when no error is involved in the electron beam exposure apparatus.

21. The exposure apparatus as claimed in claim 20, further comprising a first expect memory storing thereon the first expect data generated by said expect data generating section, wherein said comparing section compares the first expect data output from said first expect memory with the first exposure data output from said buffer memory.

22. The exposure apparatus as claimed in claim 21, further comprising a wafer stage mounting thereon the wafer, wherein said wafer stage moves in a first direction, then changes the direction and moves to a second direction opposite from the first direction, said exposure section performs first exposure processing on the first area while said wafer stage is moving in the first direction and performs second exposure processing on the first area while said wafer stage is moving in the second direction, and the first expect data are written to said first expect memory between the first exposure processing and the second exposure processing.

23. The exposure apparatus as claimed in claim 21, further comprising a wafer stage mounting thereon the wafer, wherein said wafer stage moves in a first direction, then changes the direction and moves to a second direction opposite from the first direction, said exposure section performs second exposure processing on the first area while said wafer stage is moving in the second direction after it has performed first exposure processing on the first area while said wafer stage has been moving in the first direction, and the first expect data, which are generated by said expect data generating section, are written to said first expect memory during the first exposure processing.

24. The exposure apparatus as claimed in claim 23, further comprising a second expect memory storing thereon second expect data to be output from said buffer memory based on a second control signal for exposing a second area of the wafer, wherein said wafer stage changes the direction once again to the first direction after it has moved in the second direction, said exposure section performs third exposure processing on the second area while said wafer stage is moving in the first direction after performing the second exposure processing on the first area while said wafer stage has been moving in the second direction, said comparing section compares the first expect data output from said first expect memory during the second exposure processing with the first exposure data output from said buffer memory, and the second expect data, which are generated by said expect data generating section, are written to said second expect memory during the second exposure processing.

* * * * *